United States Patent
Laven et al.

(10) Patent No.: US 10,475,910 B2
(45) Date of Patent: *Nov. 12, 2019

(54) SEMICONDUCTOR DEVICE HAVING AN INSULATED GATE BIPOLAR TRANSISTOR ARRANGEMENT

(71) Applicant: Infineon Technologies AG, Neubiberg (DE)

(72) Inventors: Johannes Georg Laven, Taufkirchen (DE); Hans-Joachim Schulze, Taufkirchen (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 140 days.

This patent is subject to a terminal disclaimer.

(21) Appl. No.: 14/834,542

(22) Filed: Aug. 25, 2015

(65) Prior Publication Data
US 2015/0364588 A1 Dec. 17, 2015

Related U.S. Application Data

(63) Continuation of application No. 14/040,891, filed on Sep. 30, 2013, now Pat. No. 9,147,727.

(51) Int. Cl.
*H01L 29/06* (2006.01)
*H01L 29/423* (2006.01)
(Continued)

(52) U.S. Cl.
CPC ...... *H01L 29/7397* (2013.01); *H01L 29/0615* (2013.01); *H01L 29/0619* (2013.01);
(Continued)

(58) Field of Classification Search
USPC ....... 257/139, 197, 273, 373, 511, 525, 526, 257/565, E31.069, 147, 372, E27.063
See application file for complete search history.

(56) References Cited

U.S. PATENT DOCUMENTS 6,303,961 B1    10/2001  Shibib
2001/0011745 A1  8/2001  Kushida
(Continued)

FOREIGN PATENT DOCUMENTS

CN    102195623 A    9/2011
CN    103219338 A    7/2013
WO    2009062876 A1  5/2009

OTHER PUBLICATIONS

Kimmer, Thomas et al., "TRENCHSTOP 5: A New Application Specific IGBT Series", PCIM Europe 2012, Paper 11, VDE Verlag GmbH, May 2012, Nuremberg, pp. 120-127.
(Continued)

*Primary Examiner* — Timor Karimy
(74) *Attorney, Agent, or Firm* — Murphy, Bilak & Homiller, PLLC

(57) ABSTRACT

A semiconductor device includes an insulated gate bipolar transistor (IGBT) arrangement having a first configuration region of emitter-side insulated gate bipolar transistor structures, a second configuration region of emitter-side insulated gate bipolar transistor structures, a collector layer and a drift layer. The drift layer is arranged between the collector layer and the emitter-side insulated gate bipolar transistor structures of the first configuration region and the second configuration region. The collector layer includes at least a first doping region laterally adjacent to a second doping region, the doping regions having different charge carrier life times, different conductivity types or different doping concentrations. The first configuration region is located with at least a partial lateral overlap to the first doping region, and the second configuration region is located with at least a partial lateral overlap to the second doping region.

15 Claims, 17 Drawing Sheets

(51) Int. Cl.
*H01L 29/739* (2006.01)
*H01L 29/66* (2006.01)
*H01L 29/08* (2006.01)
*H01L 29/40* (2006.01)
*H01L 29/10* (2006.01)

(52) U.S. Cl.
CPC ...... *H01L 29/0684* (2013.01); *H01L 29/0696* (2013.01); *H01L 29/0804* (2013.01); *H01L 29/0821* (2013.01); *H01L 29/407* (2013.01); *H01L 29/4236* (2013.01); *H01L 29/66325* (2013.01); *H01L 29/7393* (2013.01); *H01L 29/1095* (2013.01); *H01L 29/42368* (2013.01); *H01L 29/7396* (2013.01)

(56) References Cited

U.S. PATENT DOCUMENTS

| | | | |
|---|---|---|---|
| 2005/0035405 A1 | 2/2005 | Mauder et al. | |
| 2007/0120181 A1 | 5/2007 | Ruething et al. | |
| 2009/0096027 A1* | 4/2009 | Hirler | H01L 29/0696 257/356 |
| 2009/0160034 A1 | 6/2009 | Suzuki et al. | |
| 2009/0283799 A1* | 11/2009 | Ruething | H01L 29/0834 257/143 |
| 2010/0285646 A1* | 11/2010 | Lin | H01L 21/26586 438/270 |
| 2011/0127576 A1 | 6/2011 | Schulze et al. | |
| 2013/0020634 A1* | 1/2013 | Watanabe | H01L 29/66348 257/330 |
| 2013/0087829 A1* | 4/2013 | Tanabe | H01L 29/66348 257/140 |
| 2015/0015309 A1* | 1/2015 | Werber | H01L 29/7397 327/109 |

OTHER PUBLICATIONS

Laska, T. et al., "The Field Stop IGTB (FS IGBT)—A New Power Device Concept with a Great Improvement Potential", ISPSD 2000, IEEE, May 2000, Toulouse, France, pp. 355-358.

Schulze, H.-J. et al., "Increase of the Robustness of the Junction Terminations of Power Devices by a Lateral Variation of the Emitter Efficiency", Proceedings of The 25th International Symposium on Power Semiconductor Devices & ICs, Kanazawa, IEEE, 2013, pp. 257-260.

* cited by examiner

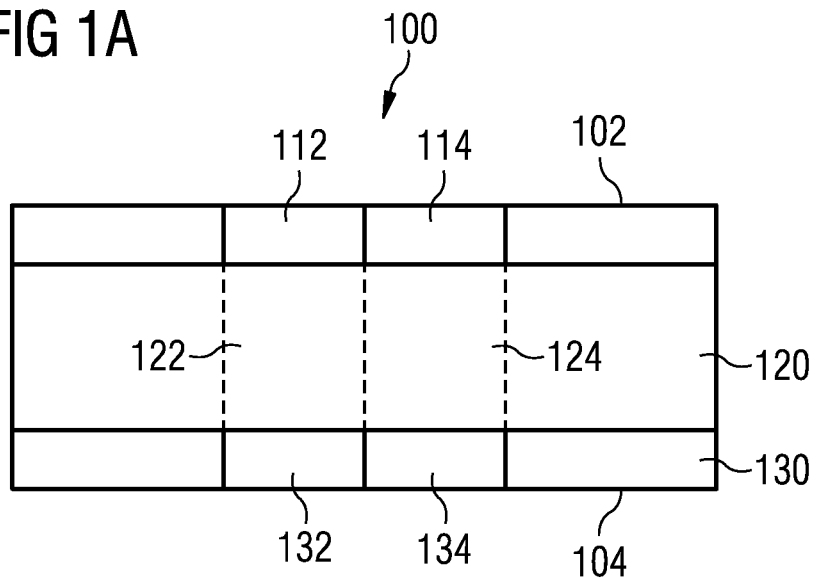
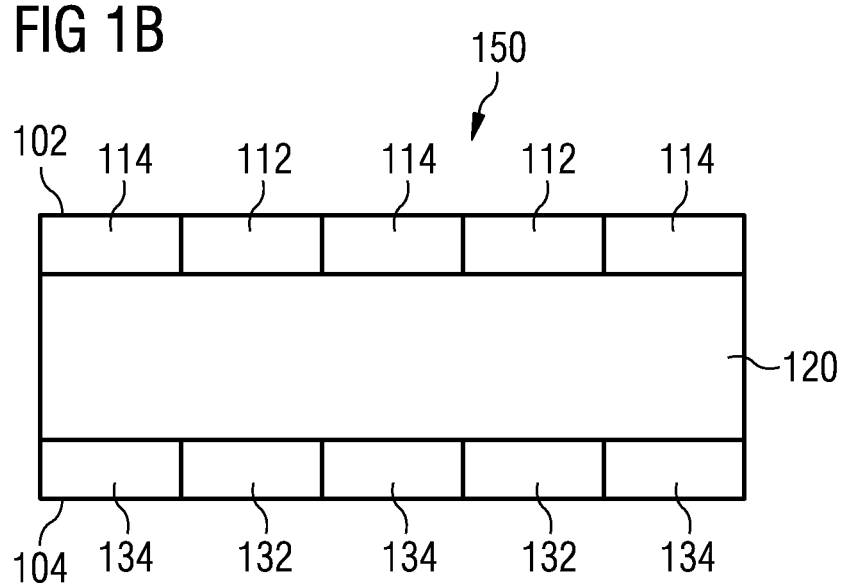

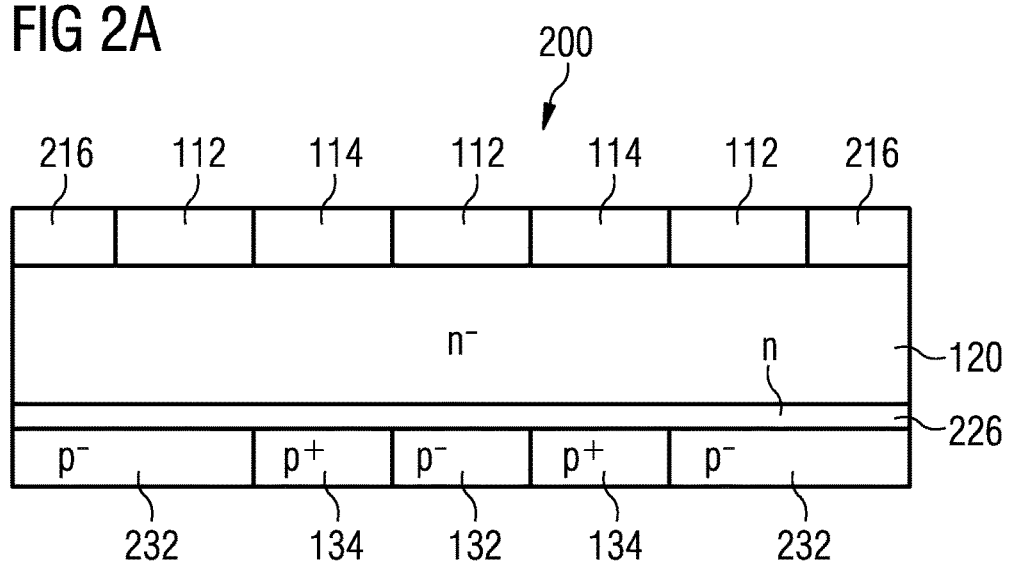
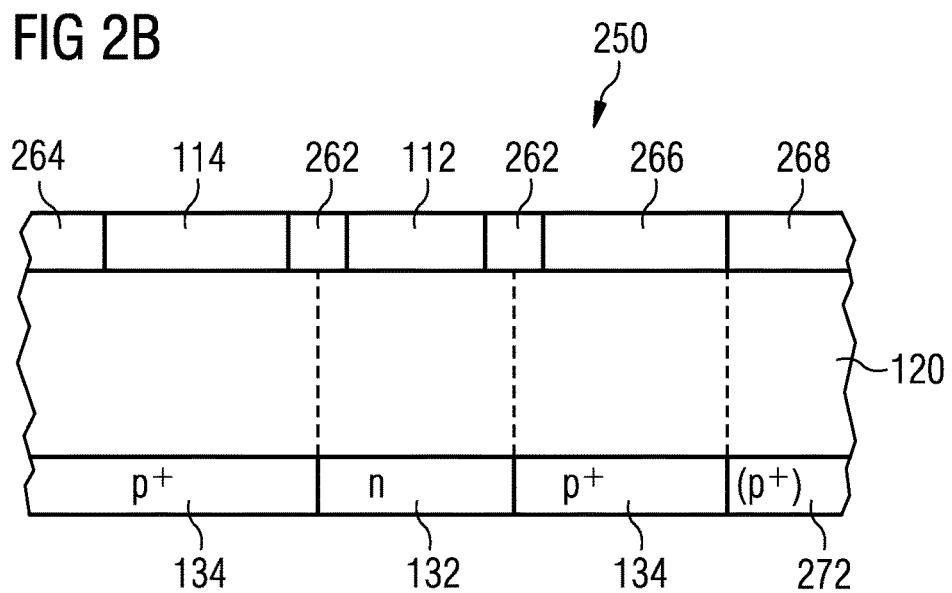

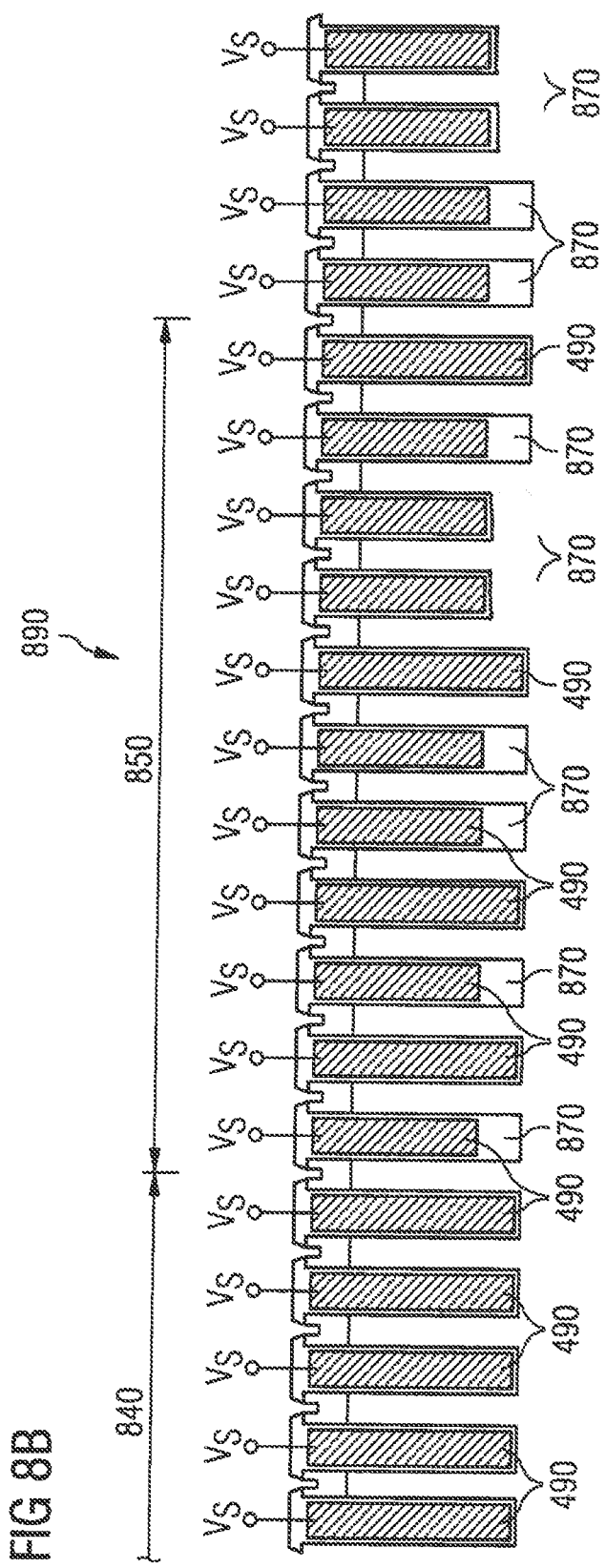

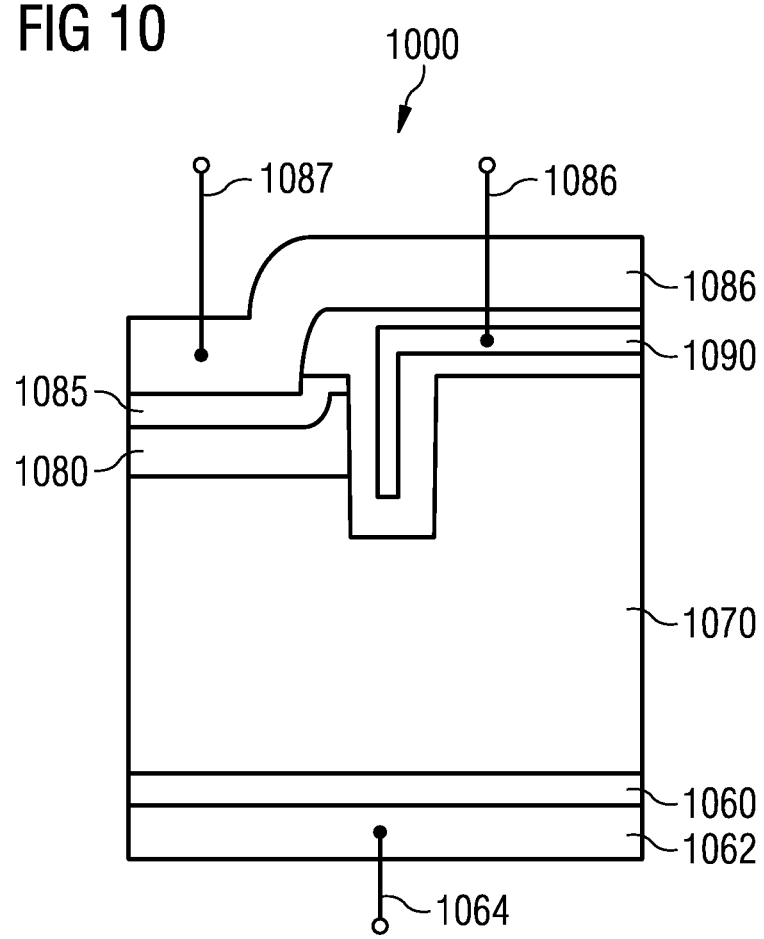

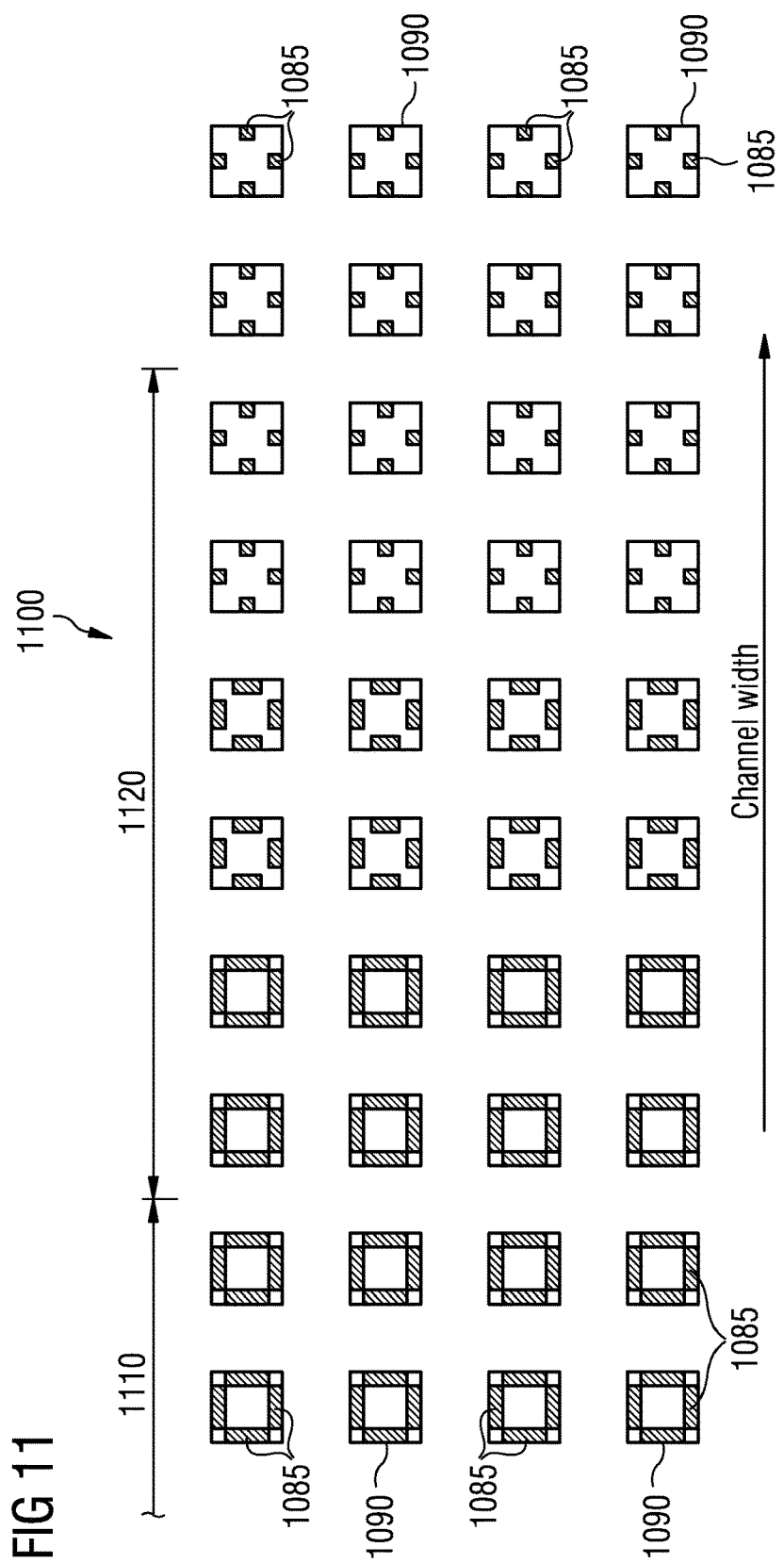

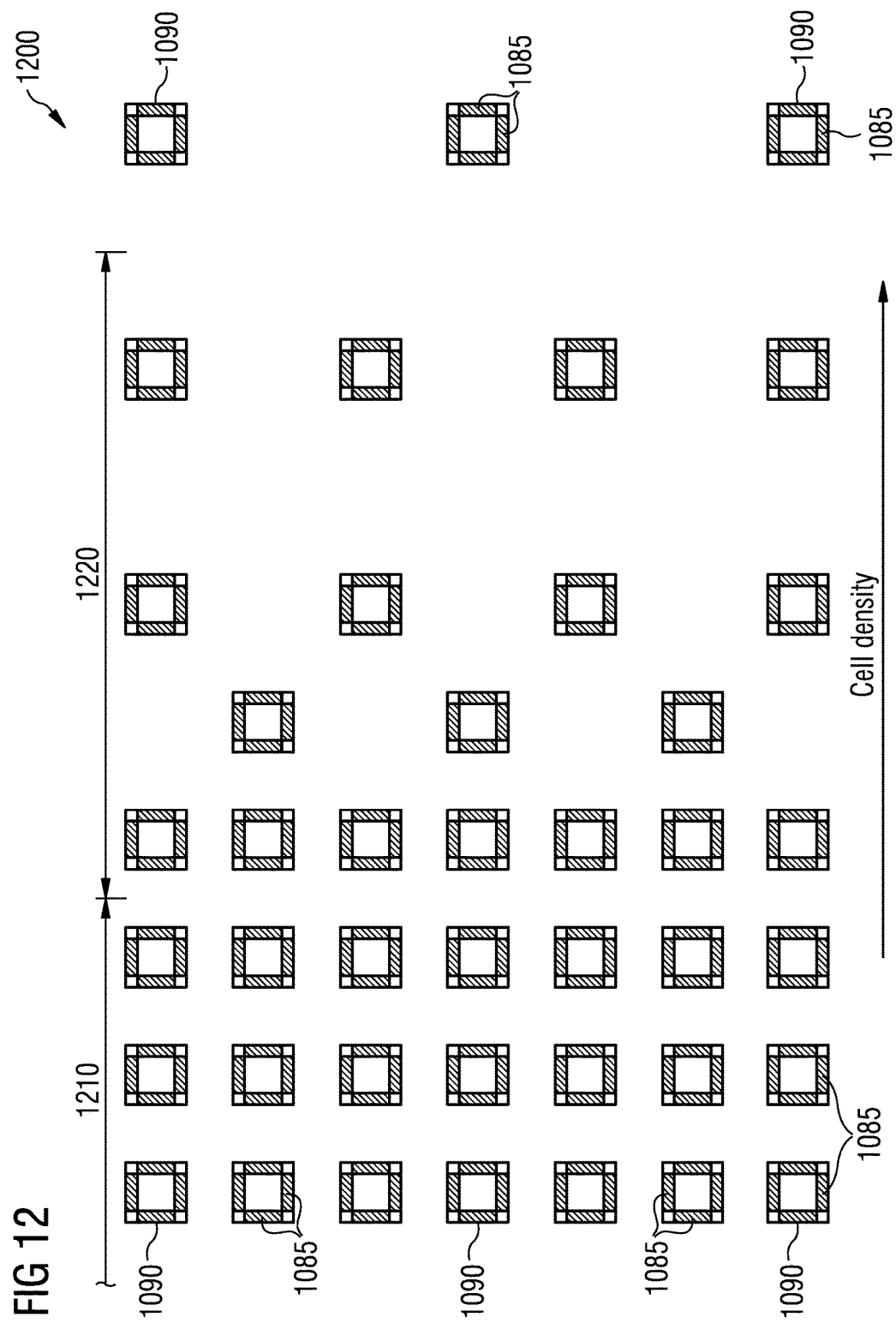

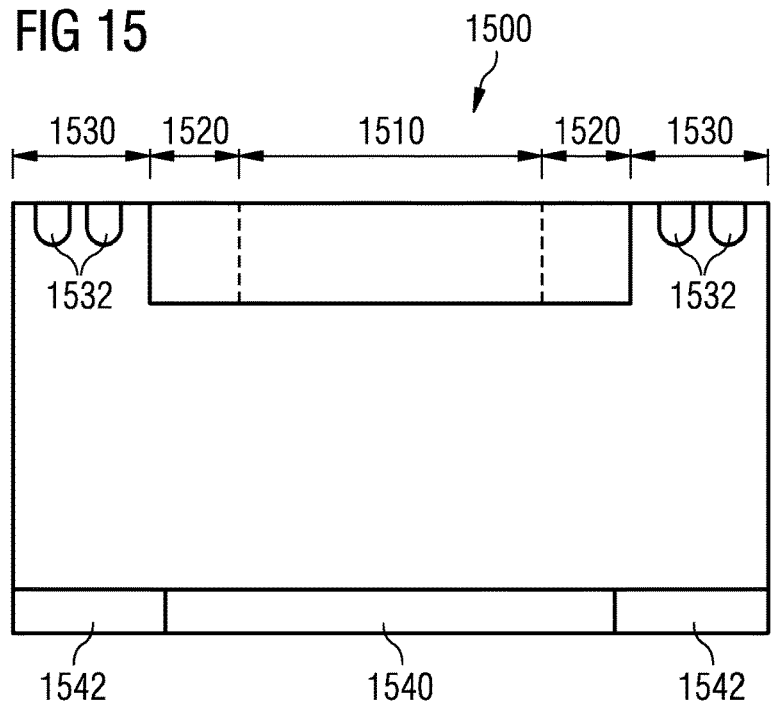
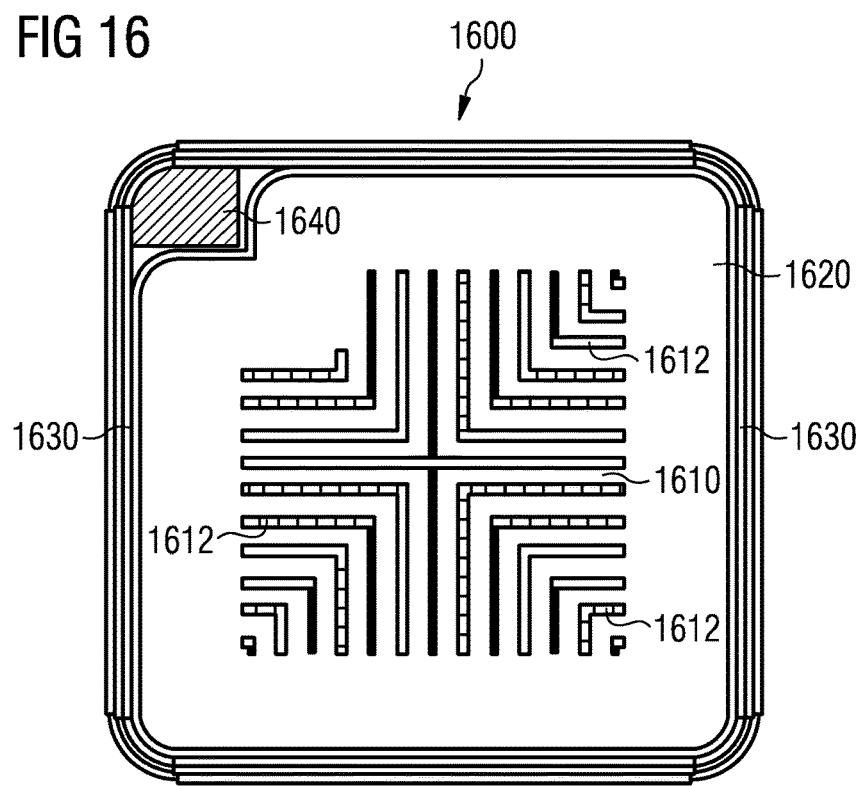

SEMICONDUCTOR DEVICE HAVING AN INSULATED GATE BIPOLAR TRANSISTOR ARRANGEMENT

TECHNICAL FIELD

Embodiments relate to measures for increasing the durability or life-cycle of semiconductor devices and in particular to a semiconductor device and a method for manufacturing a semiconductor device.

BACKGROUND

The breakdown of electronic devices is often caused by a degradation or disruption of a semiconductor device due to high currents. For example, during the shutdown or switching off of insulated gate bipolar transistor devices (IGBT) increased hole currents may occur, which may lead to dynamic avalanche and consequently to a destruction of the device. Further, in a conductive state of a device, the temperature due to high currents within the device may vary over the device. It is desired to decrease the risk of destruction due to high currents.

SUMMARY

An embodiment relates to a semiconductor device comprising an insulated gate bipolar transistor arrangement. The insulated gate bipolar transistor arrangement comprises at least a first configuration region of emitter-side insulated gate bipolar transistor structures and a second configuration region of emitter-side insulated gate bipolar transistor structures. The first configuration region and the second configuration region are arranged at a main surface of a semiconductor substrate of the semiconductor device. Further, the insulated gate bipolar transistor arrangement comprises a collector layer and a drift layer. The collector layer is arranged at a backside surface of the semiconductor substrate of the semiconductor device and the drift layer is arranged between the collector layer and the emitter-side insulated gate bipolar transistor structures of the first configuration region and the second configuration region. Additionally, the collector layer comprises at least a first doping region laterally adjacent to a second doping region. The first doping region and the second doping region comprise different charge carrier life times, different conductivity types or different doping concentrations. Further, the first configuration region is located with at least a partial lateral overlap to the first doping region and the second configuration region is located with at least a partial lateral overlap to the second doping region. The first configuration region, the first doping region, the second configuration region and the second doping region are configured so that a first average density of free charge carriers within a part of the drift layer facing the first doping region differs from a second average density of free charge carriers within a part of the drift layer facing the second doping region by less than 20% of the second average density of free charge carriers in an on-state of the semiconductor device.

Some embodiments relate to a semiconductor device comprising an insulated gate bipolar transistor arrangement. The insulated gate bipolar transistor arrangement comprises a plurality of configuration regions arranged within a cell region of the semiconductor device at a main surface of the semiconductor substrate of the semiconductor device. Each configuration region of the plurality of configuration regions comprises emitter-side insulated gate bipolar transistor structures. Further, the insulated gate bipolar transistor arrangement comprises a collector layer and a drift layer. The collector layer is arranged at a backside surface of the semiconductor substrate of the semiconductor device and the drift layer is arranged between the collector layer and the emitter-side insulated gate bipolar transistor structures of the plurality of configuration regions. Additionally, the collector layer comprises a plurality of doping regions within the cell region at the backside surface of the semiconductor substrate of the semiconductor device. The doping regions of the plurality of doping regions comprise at least partly different charge carrier life times, different conductivity types or different doping concentrations. Further, the configuration regions of the plurality of configuration regions and the doping regions of the plurality of doping regions are configured so that the average densities of free charge carriers within parts of the drift layer facing the respective doping regions of the plurality of doping regions differ from each other by less than 20% of an average densities of free charge carriers within the cell region in an on-state of the semiconductor device.

Some embodiments relate to a method for forming a semiconductor device comprising an insulated gate bipolar transistor arrangement. The method comprises forming at least a first configuration region of emitter-side insulated gate bipolar transistor structures of the insulated gate bipolar transistor arrangement and a second configuration region of emitter-side insulated gate bipolar transistor structures of the insulated gate bipolar transistor arrangement arranged at a main surface of a semiconductor substrate of the semiconductor device. Further, the method comprises forming a collector layer of the insulated gate bipolar transistor arrangement arranged at a backside surface of the semiconductor substrate of the semiconductor device. A drift layer is arranged between the collector layer and the emitter-side insulated gate bipolar transistor structures of the first configuration region and the second configuration region. Additionally, the collector layer comprises at least a first doping region laterally adjacent to a second doping region, wherein the first doping region and the second doping region comprise different charge carrier life times, different conductivity types or different doping concentrations. The first configuration region is located with at least a partial lateral overlap to the first doping region and the second configuration region is located with at least a partial lateral overlap to the second doping region. Further, the first configuration region, the first doping region, the second configuration region and the second doping region are configured so that a first average density of free charge carriers within a part of the drift layer facing the first doping region differs from a second average density of free charge carriers within a part of the drift layer facing the second doping region by less than 20% of the second average density in an on-state of the semiconductor device.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which FIG. 1A shows a schematic cross-section of a semiconductor device;

FIG. 1B shows a schematic cross-section of a semiconductor device;

FIG. 2A shows a schematic cross-section of a semiconductor device;

FIG. 2B shows a schematic cross-section of a semiconductor device;

FIG. 8B shows a schematic cross-section of a Mesa-insulated gate bipolar transistor structure;

FIG. 10 shows a schematic cross-section of a trench-insulated gate bipolar transistor structure;

FIG. 11 shows a schematic top view of a trench-insulated gate bipolar transistor structure;

FIG. 12 shows a schematic top view of a trench-insulated gate bipolar transistor structure;

FIG. 15 shows a schematic cross-section of a semiconductor device;

FIG. 16 shows a schematic top view of a backside of a semiconductor device;

DETAILED DESCRIPTION

Figure 3:
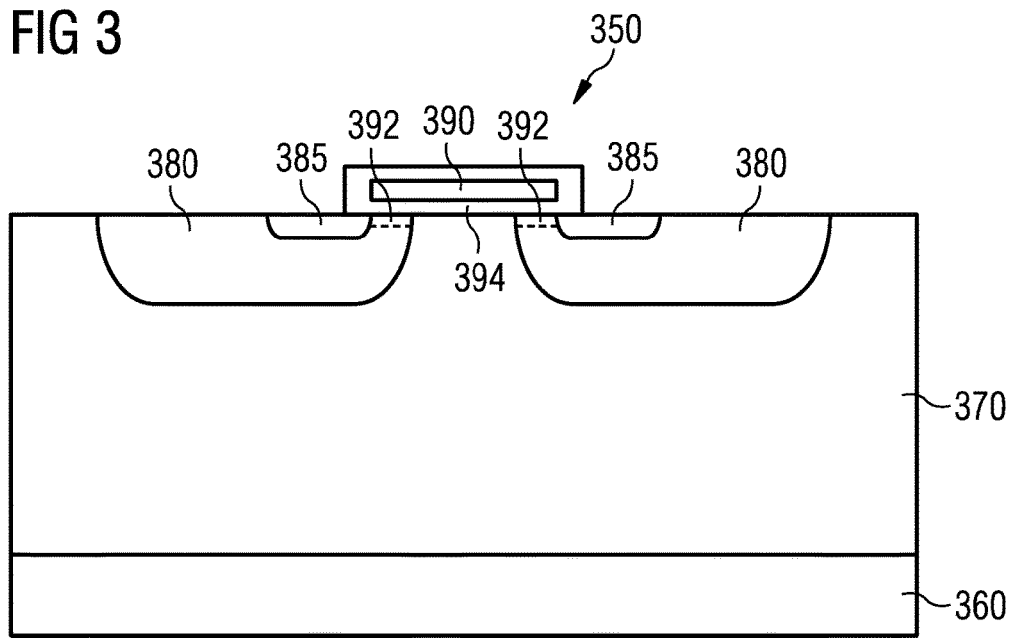
FIG. 3 shows a schematic illustration of a of an insulated gate bipolar transistor structure.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1A shows a schematic cross-section of a semiconductor device 100 according to an embodiment. The semiconductor device 100 comprises an insulated gate bipolar transistor arrangement. The insulated gate bipolar transistor arrangement comprises at least a first configuration region 112 of emitter-side insulated gate bipolar transistor structures and a second configuration region 114 of emitter-side insulated gate bipolar transistor structures. The first configuration region 112 and the second configuration region 114 are arranged at a main surface 102 of a semiconductor substrate of the semiconductor device 100. Further, the insulated gate bipolar transistor arrangement comprises a collector layer 130 and a drift layer 120. The collector layer 130 is arranged at a backside surface 104 of the semiconductor substrate of the semiconductor device 100 and the drift layer 120 is arranged between the collector layer 130 and the emitter-side insulated gate bipolar transistor structures of the first configuration region 112 and the second configuration region 114. The collector layer 130 comprises at least a first doping region 132 laterally adjacent to a second doping region 134. The first doping region 132 and the second doping region 134 comprise different charge carrier life times, different conductivity types or different doping concentrations. Additionally, the first configuration region 112 is located with at least a partial lateral overlap to the first doping region 132 and the second configuration region 114 is located with at least a partial lateral overlap to the second doping region 134. Further, the first configuration region 112, the first doping region 132, the second configuration region 114 and the second doping region 134 are configured so that a first average density of free charge carriers within a part 122 of the drift layer 120 facing the first doping region 132 differs from a second average density of free charge carriers within a part 124 of the drift layer 120 facing the second doping region 134 by less than 20% of the second average density in an on-state of the semiconductor device 100.

By implementing different configurations of emitter-side insulated gate bipolar transistor structures at the main surface 102 opposite to different doping regions at the back side 104, the varying influence of the different doping regions to the density of free charge carriers can be at least partly compensated by the different configurations of emitter-side insulated gate bipolar transistor structures so that the difference between the average densities of free charge carriers can be kept low. In this way, the temperature distribution over at least a part of the semiconductor substrate in the on-state can be kept very homogenous. Therefore, the lifecycle or durability of the device may be increased.

The semiconductor device 100 may be implemented by any semiconductor processing technology capable of forming emitter-side insulated gate bipolar transistor structures, for example. In other words, the semiconductor substrate of the semiconductor device 100 may be a silicon-based semiconductor substrate, a silicon carbide-based semiconductor substrate, a gallium arsenide-based semiconductor substrate or a gallium nitride-based semiconductor substrate, for example. A semiconductor device 100 may comprise mainly or only the insulated gate bipolar transistor arrangement (e.g. and an edge termination structure) or may comprise further electrical elements or circuits (e.g. control unit for controlling the insulated gate bipolar transistor arrangement or a power supply unit).

The insulated gate bipolar transistor arrangement comprises a plurality of emitter-side insulated gate bipolar transistor structures distributed over the semiconductor substrate of the semiconductor device 100. The emitter-side insulated gate bipolar transistor structures may be the part of insulated gate bipolar transistor structures arranged at the emitter side of an insulated gate bipolar transistor. For example, the emitter-side insulated gate bipolar transistor structures of the first configuration region 112 and the second configuration region 114 may each comprise a body area, a source area and a gate and may share the collector layer 130 and/or the drift layer 120. In other words, the emitter-side insulated gate bipolar transistor structures may comprise separate body areas, source areas and gates, but a common collector layer 130 and a common drift layer 120, for example.

The insulated gate bipolar transistor arrangement comprises a first configuration region 112 of emitter-side insulated gate bipolar transistor structures with a first charge carrier adjustment configuration (e.g. laterally separated or laterally adjacent to) and a second configuration region 114 of emitter-side insulated gate bipolar transistor structures with a second charge carrier adjustment configuration. In other words, the emitter-side insulated gate bipolar transistor structures located within the first configuration region 112 and the emitter-side insulated gate bipolar transistor structures of the second configuration region 114 comprises different configurations or structures (e.g. regarding channel width, channel length, source current, body area width, trench depth or trench distance) in order to be capable of providing laterally different charge carrier currents or different carrier confinements, for example. Various parameters may be adjusted or selected in order to obtain a desired influence to the charge carrier current or the carrier confinement of the emitter-side insulated gate bipolar transistor structures of the first configuration region 112 and the second configuration region 114. The insulated gate bipolar transistor arrangement may comprise also more than two configuration regions with different emitter-side insulated gate bipolar transistor structures, for example.

The first configuration region 112 and the second configuration region 114 are arranged or located at a main surface 102 of the semiconductor substrate of the semiconductor device 100. In other words, at least a part of the emitter-side insulated gate bipolar transistor structures of the first configuration region 112 and at least a part of the emitter-side insulated gate bipolar transistor structures of the second configuration region 114 built up a portion of the main surface 102 (e.g. the body region and/or the source region may be located at the main surface building up a part of the main surface) or are located at the main surface 102. The first configuration region 112 and the second configuration region 114 may be located laterally adjacent to each other at the main surface 102 or a further configuration region (e.g. comprising emitter-side insulated gate bipolar transistor structures different from the emitter-side insulated gate bipolar transistor structures of the first configuration region and the second configuration region) may laterally separate the first configuration region 112 and the second configuration region 114, for example.

A main surface 102 of the semiconductor substrate may be a semiconductor surface of the semiconductor substrate towards metal layers, insulation layers or passivation layers on top of the semiconductor surface. In comparison to a basically vertical edge (e.g. resulting from separating the semiconductor substrate from others) of the semiconductor substrate, the main surface 102 of the semiconductor substrate may be a basically horizontal surface extending laterally. The main surface 102 of the semiconductor substrate may be a basically even plane (e.g. neglecting unevenness of the semiconductor structure due to the manufacturing process or trenches). In other words, the main surface 102 of the semiconductor substrate may be the interface between the semiconductor material and an insulation layer, metal layer or passivation layer on top of the semiconductor substrate.

In other words, a lateral direction or lateral expansion may be oriented basically in parallel to the main surface 102 and a vertical direction or vertical expansion may be oriented basically orthogonal to the main surface 102.

The collector layer 130 may be a lateral layer representing or forming the backside surface of the semiconductor substrate. The collector layer 130 may provide a current of charge carriers of a first type (e.g. electrons or holes) to the drift layer 120 and receives a current of charge carriers of a second type (e.g. holes or electrons) from the drift layer 120 in an on-state of the semiconductor device 100. For example, the collector layer 130 may be at least partly in contact with a metal layer so that the collector layer can be connected to an external device.

The drift layer 120 may be a lateral layer located vertically between the collector layer 130 and the emitter-side insulated gate bipolar transistor structures of the first configuration region 112 and the second configuration region 114. The drift layer 120 may be in contact with the collector layer 130 or an optional field stop layer (e.g. comprising the same conductivity type but higher doping concentration as the drift layer), for example. Alternatively, the optional field stop layer may be part of the drift layer 120.

The drift layer 120 may comprise at least mainly a first conductivity type (e.g. n or p) and the collector layer 130 may comprise at least mainly a second conductivity type (e.g. p or n). The collector layer 130 may comprise mainly the second conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping or vice-versa.

The collector layer 130 and the drift layer 120 may comprise mainly a specific conductivity type, if the parts of the semiconductor structure occupied by the collector layer 130 comprises a doping of the second conductivity type over more than 50% (or more than 70%, more than 80% or more than 90%) of the volume and the parts of the semiconductor structure occupied by the drift layer 120 comprises a doping of the first conductivity type over more than 50% (or more than 70%, more than 80% or more than 90%) of the volume, for example.

The collector layer 130 comprises two or more doping regions with at least partly different conductivity types and/or different doping concentrations. At least the first doping region 132 and the second doping region 134 comprise different conductivity types or at least the first doping region 132 and the second doping region 134 comprise different doping concentration (e.g. averaged over the respective doping region or maximum of respective doping region). Alternatively or additionally, at least the first doping region 132 and the second doping region 134 comprise different charge carrier life times. Regions of different charge carrier life times may be implemented increasing the defect density one or more regions compared to adjacent regions (e.g. by helium implant).

The first doping region 132 and the second doping region 134 are arranged laterally adjacent to each other. In other words, the conductivity type changes at a border between the first doping region 132 and the second doping region 134 (e.g. causing a pn-junction) or the doping distribution comprises a mean doping concentration (e.g. mean between averaged doping concentrations over the respective doping regions or between maximal doping concentrations of the respective doping regions) at a border between the first doping region 132 and the second doping region 134, for example.

For example, the drift layer 130 comprises at least one doping region with the first conductivity type reaching from the backside surface 104 to the drift layer 120 adjacent to at least one doping region with the second conductivity type reaching from the backside surface 104 to the drift layer 120 (e.g. implementing at least on reverse conducting region). Optionally, additionally or alternatively, the drift layer 130 may comprise a plurality of doping regions arranged in a lateral sequence so that doping regions with different conductivity type are arranged laterally alternating (e.g. implementing a plurality of reverse conducting regions). Optionally, additionally or alternatively, the drift layer 130 comprises at least one doping region with a first doping concentration reaching from the backside surface 104 to the drift layer 120 adjacent to at least one doping region with a second doping concentration reaching from the backside surface 104 to the drift layer 120 (e.g. implementing a semiconductor device with improved switch-off behavior).

The first configuration region 112 is located with at least a partial lateral overlap to the first doping region 132. In other words, the first configuration region 112 and the first doping region 132 are located at opposite surfaces of the semiconductor substrate and vertically separated from each other at least by the drift layer, but the first configuration region 112 laterally overlaps at least partly the first doping region 132 in a top view of the semiconductor substrate.

Therefore, the first configuration region 112 influences at least partly the part of the drift layer 120 facing the first doping region 132. Correspondingly, the second configuration region 114 and the second doping region 134 are located at opposite surfaces of the semiconductor substrate and vertically separated from each other at least by the drift layer, but the second configuration region 114 laterally overlaps at least partly the second doping region 134 in a top view of the semiconductor substrate. Therefore, the second configuration region 114 influences at least partly the part of the drift layer 120 facing the second doping region 134. Optionally, the first configuration region 112 may laterally extend at least over the whole first doping region 132 and/or the second configuration region 114 may laterally extend at least over the whole second doping region 134 as shown in FIG. 1A. Further optionally, the first configuration region 112 may comprise a larger or smaller lateral dimension than the first doping region 132 and/or the second configuration region 114 may comprise a larger or smaller lateral dimension than the second doping region 134.

The first configuration region 112 (e.g. regarding the configuration of the emitter-side insulated gate bipolar transistor structures and dimension), the first doping region 132 (e.g. regarding conductivity type, doping concentration and dimension), the second configuration region 114 (e.g. regarding the configuration of the emitter-side insulated gate bipolar transistor structures and dimension) and the second doping region 134 (e.g. regarding conductivity type, doping concentration and dimension) are configured so that a first average density of free charge carriers within a part of the drift layer facing the first doping region differs from a second average density of free charge carriers within a part of the drift layer facing the second doping region by less than 20% (or less than 15% or less than 10%) of the second average density in an on-state of the semiconductor device.

In other words, the emitter-side insulated gate bipolar transistor structures at the main surface 102 may be adapted to the local conditions at the backside surface 104. Emitter-side insulated gate bipolar transistor structures providing lower currents of charge carriers or causing higher carrier confinement may be implemented opposite to a doping region providing higher currents of charge carriers or causing lower carrier confinement than emitter-side insulated gate bipolar transistor structures located opposite to a doping region providing lower currents of charge carriers or causing higher carrier confinement. In other words, the combination of the backside collector structure and the correspondingly adapted configuration of the front side emitter-side insulated gate bipolar transistor structures enables that a difference between the first average density of free charge carriers and the second average density of free charge carriers can be kept below 20% (or below 15% or below 10%) of the second average density in an on-state of the semiconductor device.

The on-state of the semiconductor device 100 may be a state, in which the insulated gate bipolar transistor arrangement (e.g. the sum of all emitter-side insulated gate bipolar transistor structures comprised by the insulated gate bipolar transistor arrangement) provides a maximal overall current under normal or intended operation conditions of the semiconductor device 100 or provides a nominal current (e.g. according to the specification of the device). A nominal current may be a current, which the device is able to provide in an on-state for more than 50% (or more than 70% or more than 90%) of a life time to be reached by the device, for example.

The average density of free charge carriers within a specific region may be a number of free charge carriers per volume or per die area of the drift layer (e.g. and averaged over time after reaching constant conditions in the on-state). Due to structural inhomogeneities (e.g. positions of gates, sources and/or body areas of the emitter-side insulated gate bipolar transistor structures or the different conductivity types or doping densities of the doping regions) the density of free charge carriers may vary within the drift layer 120. However, the (first) average density of free charge carriers within the part 122 of the drift layer facing the first doping region 132 differs from the (second) average density of free charge carriers within the part 124 of the drift layer facing the second doping region 134 by less than 20% of the second average density.

The part 122 of the drift region 120 facing the first doping region 132 may be the volume occupied by drift layer 120 located closer to the first doping region 132 than to another parts of the collector layer 130. Correspondingly, the part 124 of the drift region 120 facing the second doping region 134 may be the volume occupied by drift layer 120 located closer to the second doping region 134 than to another parts of the collector layer 130. In other words, the part 122 of the drift region 120 facing the first doping region 132 may be the area of the drift region 120 located above the first doping region 132 and the part 124 of the drift region 120 facing the second doping region 134 may be the area of the drift region 120 located above the second doping region 134 in a cross section of the semiconductor substrate as indicated by the dashed lines in FIG. 1A.

For example, the first doping region 132 and the second doping region 134 may be configured so that the first doping region 132 is capable of providing (or receiving) a higher average density of charge carriers (current of electrons or current of holes) to (or from) the drift layer 120 in an on-state of the semiconductor device 100 than the second doping region 134. Further, the emitter-side insulated gate bipolar transistor structures of the first configuration region 122 and the emitter-side insulated gate bipolar transistor structures of the second configuration region 124 may be configured so that the emitter-side insulated gate bipolar transistor structures of the second configuration region 124 are capable of providing (or receiving) a higher average density of charge carriers or current of charge carriers (current of electrons or current of holes) to (or from) the drift layer 120 in an on-state of the semiconductor device 100 than the emitter-side insulated gate bipolar transistor structures of the first configuration region 122. In other words, the first doping region 132 may be configured to provide a higher average density of charge carriers or current of charge carriers to the drift layer 120 in an on-state of the semiconductor device 100 than the second doping region 134, if the emitter-side insulated gate bipolar transistor structures at the main surface 102 would comprise a homogeneous or equal configuration. Correspondingly, the emitter-side insulated gate bipolar transistor structures of the second configuration region 124 may be configured to provide a higher average density of charge carriers or current of charge carriers to the drift layer 120 in an on-state of the semiconductor device 100 than the emitter-side insulated gate bipolar transistor structures of the first configuration region 122, if the collector layer 130 would comprise a homogeneous doping concentration and conductivity type. By arranging structures with opposite effect to the density of charge carriers or current of charge carriers at least partly opposite to each other, the resulting variation of the average density of free charge carriers within the different regions of the drift layer 120 can be kept low, for example.

The lateral dimension or extension of the first configuration region 112, the first doping region 132, the second configuration region 114 and the second doping region 134 may vary in a wide range. A lateral movement of free charge carriers may be in the range of the diffusion length of the free charge carriers within the used semiconductor material. Alternatively, the thickness of the semiconductor substrate of the semiconductor device 100 may practically limit the diffusion length, since the free charge carriers may reach the backside of the semiconductor substrate before reaching a significant larger lateral distance than the thickness of the semiconductor device.

For example, optionally, additionally or alternatively to one or more aspects mentioned above, the first configuration region 112, the first doping region 132, the second configuration region 124 and the second doping region 134 may comprise each a lateral dimension of more than half (or more than once or more than twice) of a diffusion length of free charge carriers within the drift layer 120 or more than half (or more than once or more than twice) of a thickness of the semiconductor substrate of the semiconductor device 100. Regions large than half a diffusion length of free charge carriers within the drift layer 120 or half a thickness of the semiconductor substrate of the semiconductor device 100 may cause significant variations of the local density of free charge carriers in the part of the drift layer 120 facing the respective region. Such a variation may be avoided or may be kept low by implementing a corresponding counter region at the opposite side of the semiconductor substrate, for example.

The first configuration region 112, the first doping region 132, the second configuration region 114 and the second doping region 134 may be arranged at arbitrary locations on the semiconductor substrate. For example, the first configuration region 112 and the second configuration region 114 may be located within a cell region of the semiconductor substrate. The cell region area may be laterally enclosed by an edge region (e.g. comprising an edge termination structure in order to reduce the electric fields towards the edge) surrounding the semiconductor substrate at an edge (e.g. resulting from a separation of the semiconductor substrate from other semiconductor dies on a wafer) of the semiconductor substrate. The edge region may comprise a lateral width of less than a quarter (or less than 20% or less than 10%) of a lateral dimension of the semiconductor substrate (e.g. but lager than 0.1%, larger than 1% or larger than 5% of a lateral dimension of the semiconductor substrate). In other words, the measures for homogenizing the average density of free charge carriers may be implemented in an area in the proximity to the center of the semiconductor substrate.

The cell region of the semiconductor substrate may be a region laterally expanding over the semiconductor substrate comprising or providing more than 50% (or more than 70%, more than 80% or more than 90%) of the current flow through the insulated gate bipolar transistor arrangement of the semiconductor device 100 in an on-state of the insulated gate bipolar transistor arrangement. The size of the cell region may be dependent on the absolute current-rating of the chip (i.e., the total chip size), for example.

Optionally, alternatively or additionally to one or more aspects mentioned above, the insulated gate bipolar transistor arrangement may comprise a plurality of configuration regions arranged within a cell region of the semiconductor device 100 at the main surface 102 of the semiconductor substrate of the semiconductor device 100. Further, the collector layer 130 may comprise a plurality of doping regions within the cell region at the backside surface 104 of the semiconductor substrate of the semiconductor device 100. The configuration regions of the plurality of configuration regions and the doping regions of the plurality of doping regions may be configured so that the average densities of free charge carriers within parts of the drift layer 120 facing the respective doping regions of the plurality of doping regions differ from each other by less than 20% of an average densities of free charge carriers within the cell region in an on-state of the semiconductor device 100. In other words, the emitter-side insulated gate bipolar transistor structures at the main surface 102 may be adapted to the distribution of doping regions within the collector layer 130 over the cell region so that the variation of the average densities of free charge carriers within the part of the drift layer 120 located in the cell region can be kept low. This may keep the variation of the temperature within cell region low. In this way, the overall current provideable or switchable by the semiconductor device 100 may be increased and/or the life-cycle or durability of the device may be increased, for example.

FIG. 1B shows a schematic cross-section of a semiconductor device 150 according to an embodiment. The implementation of the semiconductor device 150 is similar to the implementation shown in FIG. 1A. However, an alternating sequence of first configuration regions 112 and second configuration regions 114 is arranged at the main surface 102 opposite to an alternating sequence of first doping regions 132 and second doping regions 134 at the backside surface 104. More details and aspects are described in connection with the embodiments above (e.g. FIG. 1A).

FIG. 2A shows a schematic cross-section of a semiconductor device 200 according to an embodiment. The implementation of the semiconductor device 200 is similar to the implementation shown in FIGS. 1A and 1B. However, an alternating sequence of first configuration regions 112 and second configuration regions 114 is arranged at the main surface 102 opposite to an alternating sequence of first doping regions 132 and second doping regions 134 at the backside surface 104 within a cell region of the semiconductor substrate. In this case, the first doping regions 132 comprise a light p-doping and the second doping regions 134 comprise a high p-doping. Further, the doping regions of the collector layer are surrounded by a lightly p-doped edge region 232 at an edge of the semiconductor substrate and the configuration regions are surrounded by an edge termination region 216 (e.g. comprising a lateral edge termination structure or guard rings) at an edge of the semiconductor substrate. The configurations regions 114 opposite to the highly p-doped regions 114 comprise emitter-side insulated gate bipolar transistor structures capable of providing a lower density of charge carriers or current of charge carriers than the emitter-side insulated gate bipolar transistor structures of the configurations regions 112 opposite to the lightly p-doped regions 112, for example. The highly p-doped regions 114 may provide holes for a longer time during switch-off than the lightly p-doped regions 112 resulting in an improved switch-off behavior, for example. The drift layer 120 comprises a low n-doping and an n-doped field stop layer 226 is arranged between the drift layer 1210 and the collector layer. More details and aspects are described in connection with the embodiments above (e.g. FIGS. 1A and 1B).

FIG. 2B shows a schematic cross-section of a part (e.g. between a center of the semiconductor substrate to the left and an edge of the semiconductor substrate to the right) of a semiconductor device 250 according to an embodiment. The implementation of the semiconductor device 250 is similar to the implementation shown in FIG. 1A. In this case, the first doping region 132 comprises an n-doping (e.g. implementing reverse conducting regions or n-shorts) and the second doping regions 134 comprise a high p-doping. Further, the doping regions of the collector layer are surrounded by a medium-to-high p-doped edge region 272 at an edge of the semiconductor substrate. The first configurations region 112 is laterally separated from the second configuration region 114 by a border configuration region 262 located opposite to the border of the first doping region 132 and the adjacent doping regions. Further, the configuration regions are surrounded by an edge termination region 268 (e.g. comprising a lateral edge termination structure or guard rings) at an edge of the semiconductor substrate and a transition configuration region 266 is arranged laterally between one of the border configuration regions 262 and the edge termination region 268. Additionally, a center configuration region 264 is arranged adjacent to the second configuration region 114 and extends laterally towards a center of the semiconductor substrate.

The first configurations region 112 is configured to be capable to provide a first density of charge carriers or current of charge carriers (e.g. very low current or even zero current, e.g. due to a very small channel width <<<y or even no channel caused by no gate trenches or no source regions implementing a desaturation channel, for example), the second configuration region 114 is configured to be capable to provide a second density of charge carriers or current of charge carriers (e.g. medium current, e.g. due to a medium channel width y), the border configuration region 262 is configured to be capable to provide a third density of charge carriers or current of charge carriers (e.g. very high current, e.g. due to a large channel width >>y), the center configuration region 264 is configured to be capable to provide a fourth density of charge carriers or current of charge carriers (e.g. very high current, e.g. due to a large channel width >>y), the edge termination region 268 is configured to be capable to provide a fifth density of charge carriers or current of charge carriers (e.g. very low current or even zero current, e.g. due to a very small channel width <<<y or even no channel) and the transition configurations region 266 is configured to be capable to provide a sixth density of charge carriers or current of charge carriers (e.g. low current, e.g. due to a small channel width <y or even no channel). Alternatively, also the border configuration region 262 or the center configuration region 264 may be considered as the second configuration region, for example. More general, the semiconductor device 250 may comprise a plurality of different configuration region and a plurality of different doping regions. More details and aspects are described in connection with the embodiments above (e.g. FIGS. 1A and 1B).

For example, emitter-side insulated gate bipolar transistor structures capable of providing a high density of charge carriers or current of charge carriers (e.g. by an increased channel width) may be implemented within at least a part of a p-pilot region (e.g. largest uninterrupted p-region at the backside of the semiconductor substrate) in order to facilitate the ignition of the insulated bipolar transistor arrangement.

An emitter-side insulated gate bipolar transistor structure of a plurality of emitter-side insulated gate bipolar transistor structures included by the insulated gate bipolar transistor arrangement can be implemented in various ways.

FIG. 3 shows a schematic cross-section of a part of an insulated gate bipolar transistor arrangement 350 according to an embodiment. The insulated gate bipolar transistor arrangement 350 comprises a semiconductor structure (e.g. silicon-based or silicon carbide-based) comprising a collector layer 360, a drift layer 370, a plurality of body areas 380, a plurality of source areas 385 and a gate 390 of a plurality of gates 390 (e.g. of similar or equal structures distributed over the insulated gate bipolar transistor arrangement). The plurality of source areas 385 and the drift layer 370 comprise at least mainly a first conductivity type (e.g. n or p) and the plurality of body areas 380 and the collector layer 360 comprise at least mainly a second conductivity type (e.g. p or n). The plurality of gates 390 are arranged so that the gates 390 are capable of causing a conductive channel 392 between the source areas 385 and the drift layer 370 through the body areas 380. The gates 390 may be electrically insulated from at least the body areas 380 by an insulation layer 394 (e.g. gate oxide layer).

In other words, the emitter-side insulated gate bipolar transistor structures of the first and the second configuration region comprise a plurality of body areas 380, a plurality of source areas 385 and a plurality of gates each 390. The plurality of source areas 385 and the drift layer 370 comprise at least mainly a first conductivity type and the plurality of body areas 380 and the collector layer 360 comprise at least mainly a second conductivity type. Further, the plurality of gates 390 are arranged so that the gates 390 are capable of causing a conductive channel 392 between the source areas 385 and the drift layer 370 through the body areas 380.

The collector layer 360, the drift layer 370, the plurality of body areas 380 and the plurality of source areas 385 may comprise mainly a specific conductivity type, if the part of the semiconductor structure occupied by the collector layer 360, the drift layer 370, the plurality of body areas 380 or the plurality of source areas 385 comprises a doping of the second conductivity type over more than 50% (or more than 70%, more than 80% or more than 90%) of the volume, for example.

The plurality of gates 390 may be arranged so that the gates 390 cause a conductive channel 392 between the source areas 385 and the drift layer 370 through the body areas 380 according to a field effect transistor principle. In other words, the plurality of gates 390 are arranged in the proximity of the body areas 380 but electrically insulated from the body area 380 by an insulation layer 390 so that a conductive channel 392 between the source areas 385 and the drift layer 370 can be controlled by a voltage applied to the gates 390.

The first and the second configuration region may each comprise a plurality of similar structures as shown in FIG. 3. The gates 390 and the source areas 385 of the first and the second configuration region may be connected to separate gate and source contacts. Alternatively, the gates 390 and the source areas 385 of the first and the second configuration region may be connected to common source and/or gate contacts (e.g. so that basically the same voltage is applied to the sources and/or the gates of the first and the second configuration region at least in an on-state of the insulated gate bipolar transistor arrangement).

In an on-state of the insulated gate bipolar transistor arrangement 350, the free charge carriers may be mainly located within the drift layer 370 so that an average density of free charge carriers can be represented by the density of free charge carriers within the drift layer. This may be valid also for other structural implementations of the insulated gate bipolar transistor arrangement (e.g. trench-insulated gate bipolar transistor arrangement or Mesa-insulated gate bipolar transistor arrangement).

The plurality of body areas 380 and the plurality of source areas 385 may be formed within the drift layer 370 by implanting ions. However, the plurality of body areas 380 and the plurality of source areas 385 may occupy only a small portion of the drift layer 370 so that the drift layer 370 comprises mainly the first conductivity type, for example. Alternatively, the plurality of body areas 380 may be deposited on top of the drift layer 370 so that the plurality of body areas 380 may be part of a body layer. Further, the plurality of source areas 385 may be implemented within the body layer by implanting ions.

The collector layer 360, the drift layer 370, the plurality of body areas 380, the plurality of cell areas 385 and the plurality of gates 390 can be arranged in various ways in order to implement an emitter-side insulated gate bipolar transistor structure. For example, the plurality of source areas 385 and the plurality of gates 390 as well as the electrical connection to this structures is located at the front-side (main surface) of the semiconductor device and the collector layer 360 as well as the electrical contact to the collector layer 360 is arranged at the backside of the semiconductor device as shown in FIG. 3.

More details and aspects are described in connection with the embodiments above (e.g. FIG. 1A to 2B).

The low difference between the average densities of free charge carriers within the drift layer 370 may be obtained or caused by various measures, which will be explained in the following and may be used independent from each other or by a combination of two or more of these measures.

For example, the source current provided to the first configuration region 112 and the second configuration region 114 may be controlled so that a desired distribution of free charge carriers in an on-state of the insulated gate bipolar transistor arrangement is obtained. In other words, the insulated gate bipolar transistor arrangement may comprise a source current supply circuit. This source current supply circuit may provide in an on-state of the insulated gate bipolar transistor arrangement a first average source current to the source areas located in the first configuration region and a second average source current to the source areas located in the second configuration region. The first average source current is different from the second average source current.

An average source current may be a current provided to source areas averaged through a region or a current per source area averaged through a region (the first configuration region and the second configuration region). In other words, the source current within the different regions may be limited so that the difference of the average densities of free charge carriers within the drift layer 120 can be kept low.

Alternatively or additionally to a different limitation of the source current, the portion of area occupied or covered by source areas within the first configuration region 112 and the second configuration region 114 may be varied. In other words, the source areas located in the first configuration region 112 may cover a larger portion of the first configuration region 112 (portion of die area occupied by the source areas) than a portion of the second configuration region 114 covered by the source areas located in the second configuration region 114. By reducing the portion of areas occupied or covered by source areas, the provided source current in the different region can be varied so that a desired distribution of the average density of free charge carriers in an on-state of the insulated gate bipolar transistor arrangement can be obtained.

A variation of the portion of area occupied or covered by the source areas can be obtained by varying the size of the masked or unmasked areas during the source implantation, for example.

Alternatively or additionally to one or more aspects described above, the channel width used for controlling the current flow in an on-state of the insulated gate bipolar transistor arrangement can be varied within the different configuration regions. In other words, an average channel width controllable by the gates located in the first configuration region 112 may be larger than an average channel width controllable by the gates located in the second configuration region 114. In this way, a significantly lower base current may be generated within the second configuration region 114 in comparison with the first configuration region 112 so that the density of free charge carriers can be adapted to the collector layer implementation.

Additionally, alternatively or optionally to one or more aspects described above, the channel length used for controlling the current flow in an on-state of the insulated gate bipolar transistor arrangement can be varied within the different configuration regions. In other words, an average channel length controllable by the gates located in the first configuration region 112 may be smaller than an average channel length controllable by the gates located in the second configuration region 114. In this way, a significantly lower base current may be generated within the second configuration region 114 in comparison with the first configuration region 112 so that the density of free charge carriers can be adapted to the collector layer implementation.

Additionally, alternatively or optionally to one or more aspects described above, the emitter-side insulated gate bipolar transistor structures may comprise a plurality of trenches reaching vertically (orthogonal to a main surface) through a body layer comprising the plurality of body regions. Further, the gates are arranged in trenches of the plurality of trenches. By implementing the gates in trenches reaching through the body regions into the drift layer, trench-emitter-side insulated gate bipolar transistor structures and/or Mesa-emitter-side insulated gate bipolar transistor structures can be provided.

Figure 4:
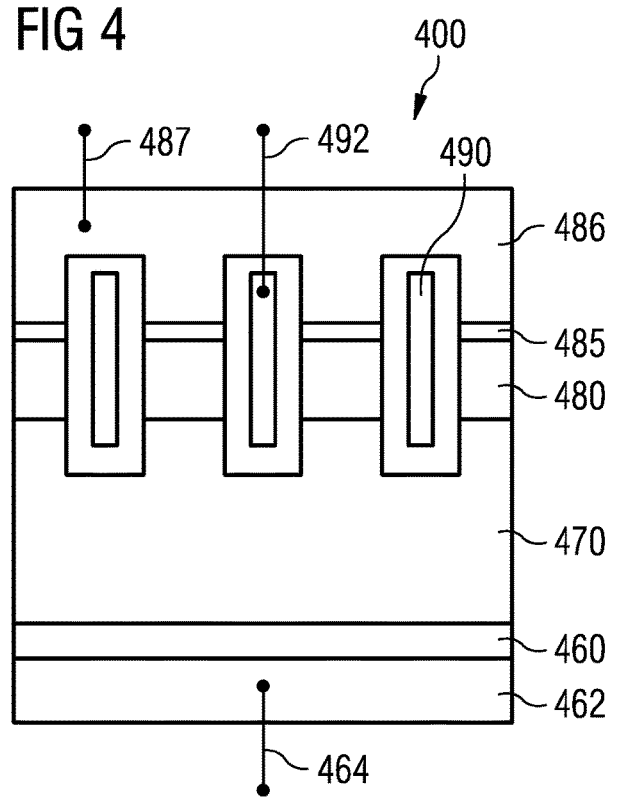
FIG. 4 shows a schematic illustration of a Mesa-insulated gate bipolar transistor structure.

FIG. 4 and FIG. 10 illustrate an overview of two examples of different cell types.

FIG. 4 shows a schematic cross section of a Mesa-insulated gate bipolar transistor structure 400. The Mesa-insulated gate bipolar transistor structure 400 comprises a collector layer 460 (e.g. doping concentration of 1e16 to 1e18/cm$^2$) and a backside collector metal layer 462 for an electrical contact 464 to the collector layer 460 of the Mesa-insulated gate bipolar transistor structure 400 at a backside of the Mesa-insulated gate bipolar transistor structure 400. Further, the Mesa-insulated gate bipolar transistor structure 400 comprises a drift layer 470 (e.g. n$^-$ basis, substrate) adjacent to the collector layer 460 and a body layer (e.g. deposited or implanted) comprising body areas 480 (e.g. doping concentration of 1e17 to 1e19/cm$^2$) adjacent to the drift layer 470 (e.g. doping concentration of 5e12 to 1e14/cm$^2$). Additionally, the Mesa-insulated gate bipolar transistor structure 400 comprises source areas 485 in contact to a source metal layer 486 for an electrical contact 487 adjacent to the body areas 480. Additionally, also the body areas 480 may be in contact to a source metal layer 486, for example. Further, trenches comprising gates 490 (e.g. poly silicon gates) reaching vertically through the body layer are arranged with predefined lateral distance to each other. The gates can be electrically connected through a gate wiring 492 (not shown). Optionally, the Mesa-insulated gate bipolar transistor structure 400 may comprise a field stop layer between the drift layer 470 and the collector layer 460.

The Mesa-insulated gate bipolar transistor structure 400 comprises body areas representing Mesa structures. A Mesa structure comprises a significantly larger (e.g. more than 5 times larger or more than 10 times larger) dimension in one lateral direction than in another lateral direction (e.g. orthogonal lateral direction). A local carrier confinement may be adjusted or varied by varying a lateral width of the Mesa structure (e.g. lateral width of body area), for example. The Mesa-insulated gate bipolar transistor structure 400 may also be called strip-insulated gate bipolar transistor structure for devices with Mesa structures with large lateral width (e.g. more than 5 μm).

Optionally, alternatively or additionally to one or more aspects mentioned above, the plurality of trenches comprises more trenches than gates comprised by the plurality of gates. The remaining trenches can be filled with spacer structures so that the distance between gates can be varied by arranging a different number of spacer structures between two neighbouring gates. In other words, gates may be arranged in a first part of the plurality of trenches and the plurality of spacer structures may be arranged within a second part of the plurality of trenches. Further, the semiconductor device may be configured to connect the plurality of spacer structures to a source potential (e.g. by electrically connecting the spacer structures to the source areas through one or more metal layer) in an on-state of the insulated gate bipolar transistor arrangement. Additionally, an average number of spacer structures between neighbouring gates (e.g. closest neighbours or closest neighbours in a predefined direction) in the first configuration region 112 may be smaller than an average number of spacer structures between neighbouring gates in the second configuration region 114. In this way, the channel area per volume controlled by gates can be varied in order to obtain a desired distribution of the density of free charge carriers. Additionally, an n-barrier layer between the trenches under the p-body region can be used to increase the carrier confinement. The n-barrier could be implemented in the first configuration of IGBT structures, whereas, the no n-barrier is implemented in the second configuration of IGBT structures. Alternatively, different n-barrier doses in the first and the second configuration results also in different charge carrier densities in front of the mesa structure.

Figure 5:
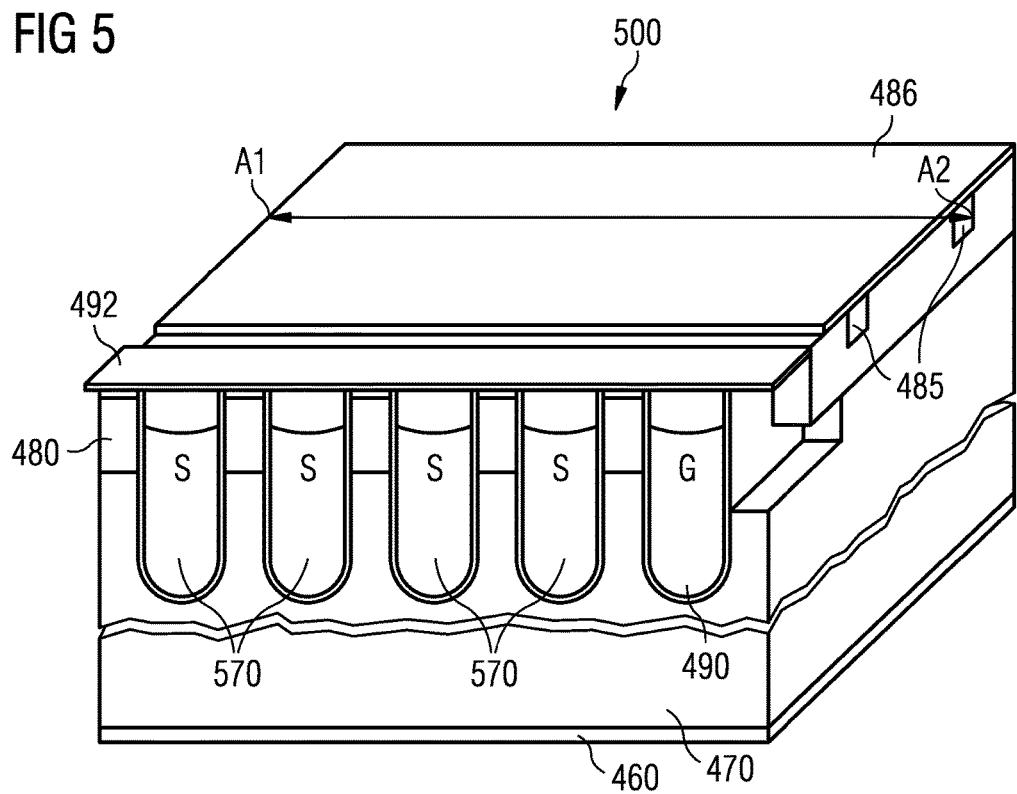
FIG. 5 shows a schematic three-dimensional illustration of a Mesa-insulated gate bipolar transistor structure.

FIG. 5 shows a schematic three dimensional view of a Mesa-insulated gate bipolar transistor structure 500. The Mesa-insulated gate bipolar transistor structure 500 is implemented similar to the Mesa-insulated gate bipolar transistor structure shown in FIG. 4, but comprises trenches including spacer structures 570 connected to source potential. The illustrated example comprises a GS4 contacting indicating that a trench containing a gate is laterally followed by four trenches containing a spacer structure 570 (e.g. same material as gates but connected to source).

Figure 6:
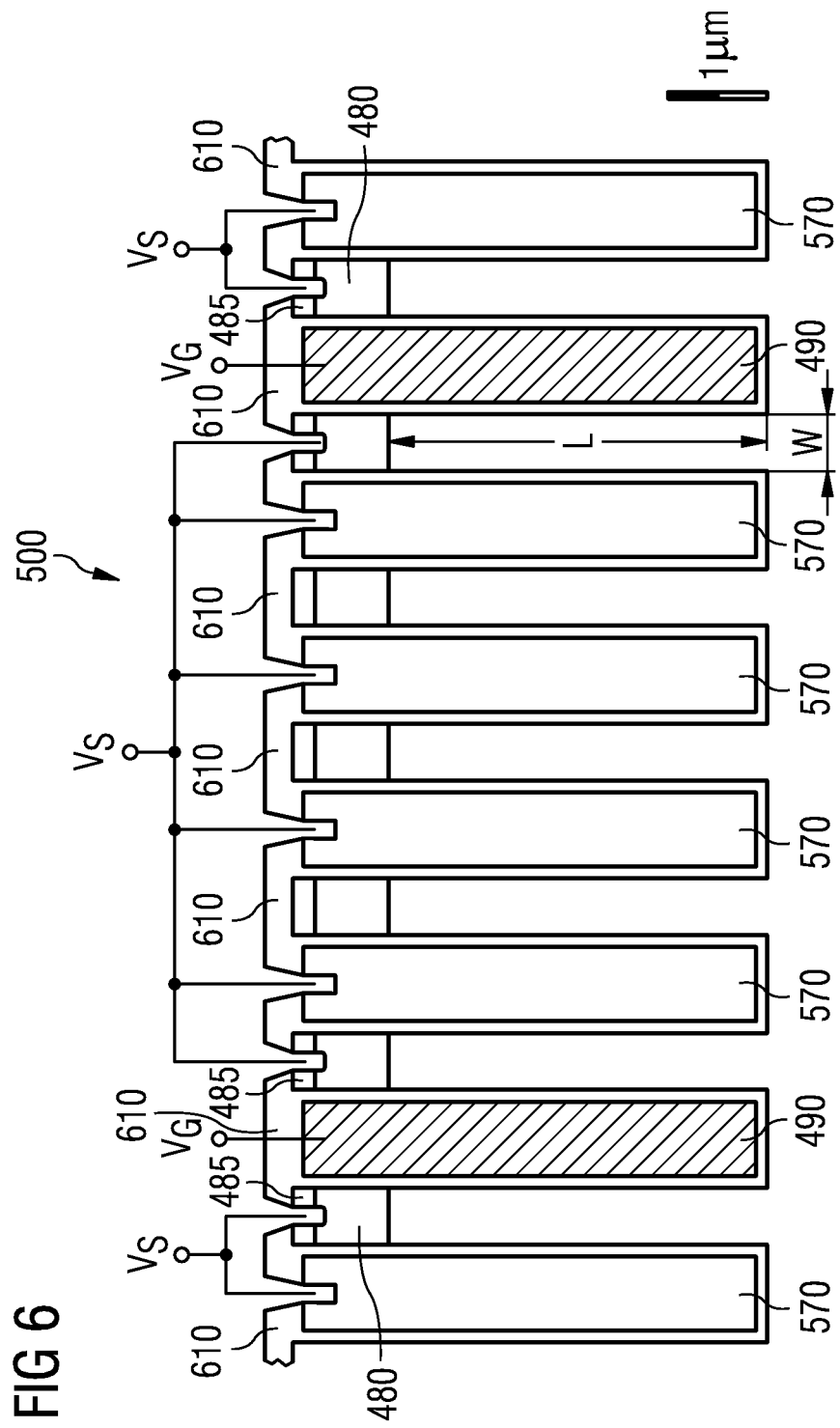
FIG. 6 shows a schematic cross-section of a Mesa-insulated gate bipolar transistor structure.

FIG. 6 shows a schematic cross section of the Mesa-insulated gate bipolar transistor structure 500 shown in FIG. 5 along the indicated line A1-A2. The gates 490 are connected or connectable to a gate potential or voltage $V_g$ and the spacer structures 570 are connected or connectable to a source potential or voltage $V_s$ in an on-state of the insulated gate bipolar transistor arrangement. Alternatively, the spacer structures may be connected or connectable also to the gate potential or voltage $V_g$, if the portion of the body layer adjacent to the spacer structures is implemented without source areas 485 so that no channel can be built up. In this way, a more homogeneously high backlash capacity may be provided to the back end (BE). The gates 490 and the spacer structures are electrically insulated from the adjacent semiconductor material by an insulation layer 610 (e.g. silicon oxide). Further, FIG. 6 indicates a Mesa width W and a Mesa height L as well as a possible scale (e.g. indicating 1 μm), for example.

Figure 7:
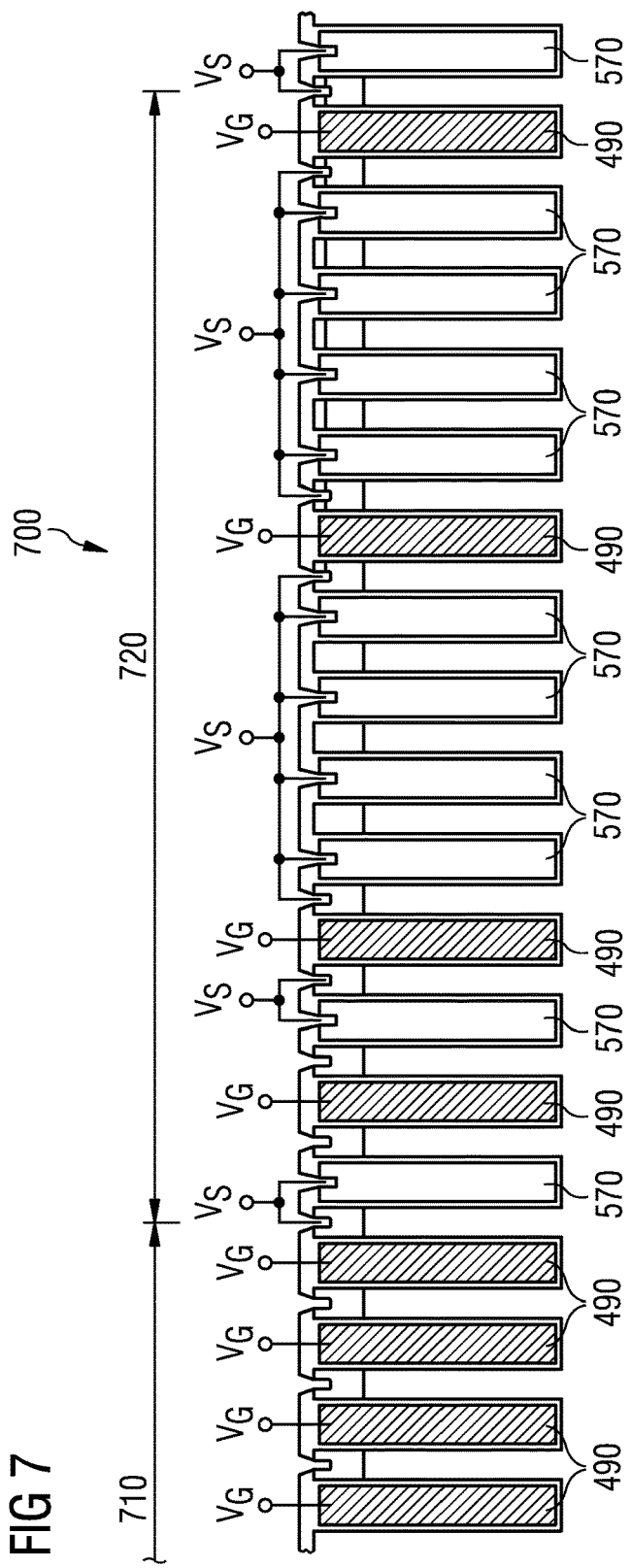
FIG. 7 shows a schematic cross-section of a Mesa-insulated gate bipolar transistor structure.

FIG. 7 shows a schematic cross section of an insulated gate bipolar transistor arrangement 700 according to an embodiment. The insulated gate bipolar transistor arrangement 700 comprises a plurality of Mesa-insulated gate bipolar transistor structures as described above (e.g. FIG. 4-6). In this example, an average number of spacer structures between neighbouring gates in the first configuration region 710 (e.g. no spacer structures between neighbouring gates) is smaller than an average number of spacer structures between neighbouring gates in the second configuration region 720 (e.g. one to four spacer structures between neighbouring gates). In this way, the channel area per volume controlled by gates is varied in order to obtain a desired distribution of the density of free charge carriers.

In other words, FIG. 7 shows an example of a Cross-cut through an emitter-structures of an MPT-IGBT. The density of the effectively active cells (cells with trenches connected to Gate-potential) is reduced from left to right resulting in a reduction of source current from left to right. Only the mesas next to the Gate-trenches are connected to source in the figure. A contacting of all mesas is also possible by which the carrier confinement may be reduced in common with the source current (e.g. by a source current supply circuit).

Optionally, additionally or alternatively to one or more aspects described above, the average distance of neighbouring trenches can be varied in order to influence the average density of free charge carriers. In other words, an average distance of neighbouring trenches located in the first configuration region may be different from an average distance of neighbouring trenches located in the second configuration region (e.g. comprising a continuously or stepwise increasing distance towards the second configuration region).

Figure 8A:
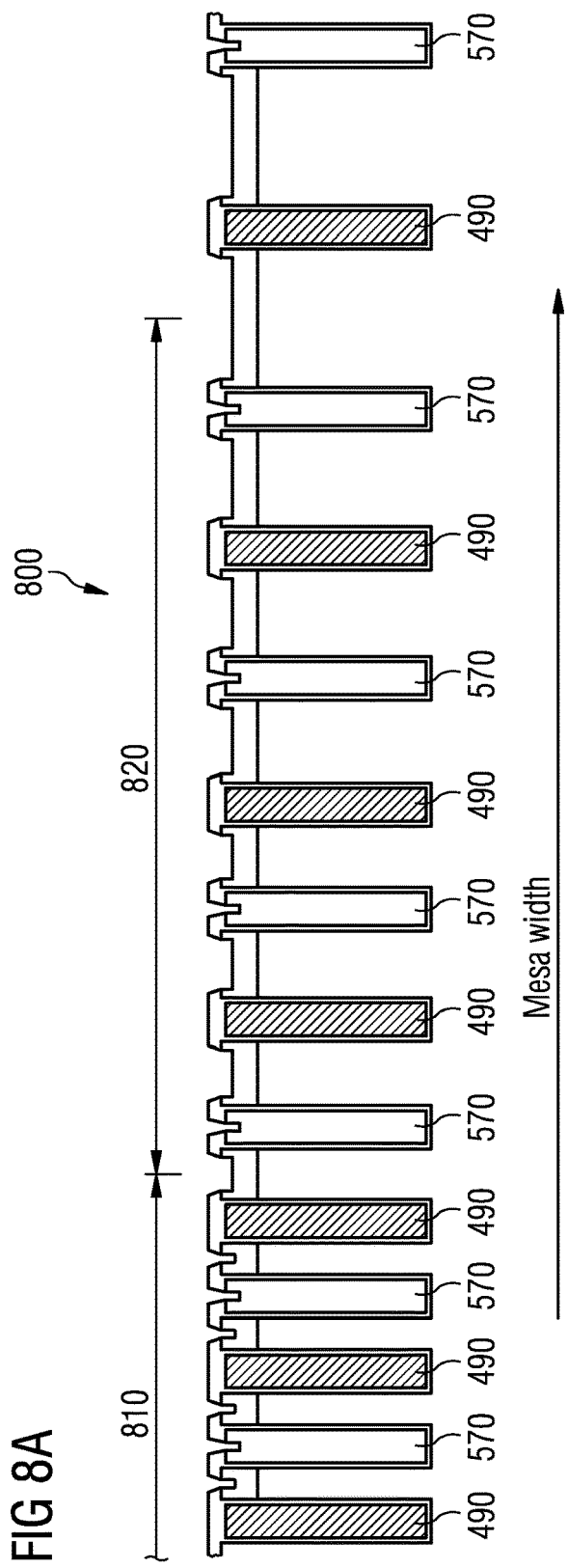
FIG. 8A shows a schematic cross-section of a Mesa-insulated gate bipolar transistor structure.

FIG. 8A shows a schematic cross section of an insulated gate bipolar transistor arrangement 800 according to an embodiment. The insulated gate bipolar transistor arrangement 800 comprises a plurality of Mesa-emitter-side insulated gate bipolar transistor structures as described above (e.g. FIG. 4-6). In this example, a number of spacer structures between neighbouring gates is constantly one. Further, an average distance of neighbouring trenches located in the first configuration region 810 (e.g. comprising a smallest distance through the whole cell region) may be smaller than an average distance of neighbouring trenches located in the second configuration region 820 (e.g. comprising a continuously or stepwise increasing distance). In this way, the channel area per volume controlled by gates and the charge-carrier density (controlled by the confinement effect) is varied in order to obtain a desired distribution of the density of free charge carriers.

In other words, FIG. 8A shows an example of a cross-cut through emitter-structures of an MPT-IGBT. The width of the mesas in the cells is increased from left to right resulting in a decrease of the carrier-confinement from left to right.

FIG. 8B shows a schematic cross section of an insulated gate bipolar transistor arrangement 890 according to an embodiment. The insulated gate bipolar transistor arrangement 890 comprises a plurality of Mesa-emitter-side insulated gate bipolar transistor structures as described above (e.g. FIG. 4-6). In this example, an average depth of the gates 490 within trenches located in the first configuration region 840 is larger than an average depth of the gates 490 within trenches located in the second configuration region 850. A varying depth of the gates 490 may be implemented by varying the depth of the trenches and/or by varying a thickness of the insulation layer 870 at the bottom of the trenches as shown in FIG. 8B. The thickness of the insulation layer 870 at the bottom of the trenches may be increased (decreasing the depth of the gates within the trenches) continuously or stepwise towards the second configuration region 850 or the thickness of the insulation layer 870 at the bottom of the trenches may be alternated between two or more predefined or fixed thicknesses so that the average depth of the gates is varied as shown in FIG. 8B. Further, the carrier confinement may be reduced and the effective channel length may be increased by a thick thickness of the trench bottom insulation layer in the transition region towards the edge, for example.

Figure 9A:
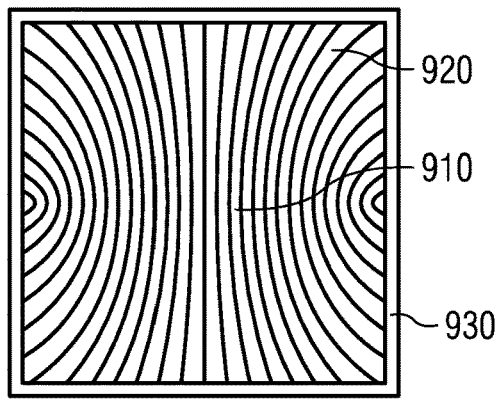
FIGS. 9A to 9C show schematic top views of semiconductor devices.
Figure 9B:
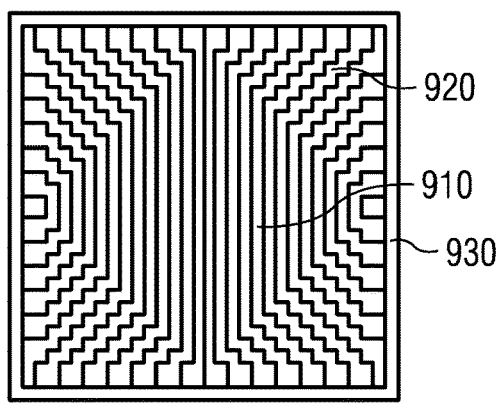
Figure 9C:
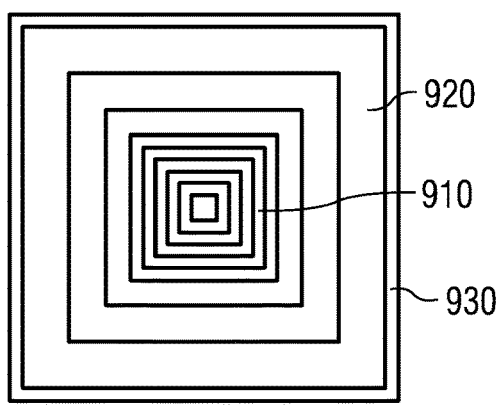

The variation of the Mesa width can be implemented in two lateral directions over the main surface of a semiconductor device. FIG. 9A-9C show possible lateral geometries of trenches containing gates indicated by the lines within the first configuration region 910 in the center of the semiconductor devices and the second configuration region 920 and an edge region 930. In other words, FIG. 9A-9C show top views of different implementation of trenches (black lines) in a strip-IGBT or Mesa IGBT according to embodiments.

FIG. 10 shows a schematic cross section of a trench-insulated gate bipolar transistor structure 1000. The trench-insulated gate bipolar transistor structure 1000 comprises a collector layer 1060 and a backside collector metal layer 1062 for an electrical contact 1064 to the collector layer 1060 of the trench-insulated gate bipolar transistor structure 1000 at a backside of the trench-insulated gate bipolar transistor structure 1000. Further, the trench-insulated gate bipolar transistor structure 1000 comprises a drift layer 1070 (e.g. n⁻ basis, substrate) adjacent to the collector layer 1070 and body areas 1080 implanted into the drift layer 1070. Additionally, the trench-insulated gate bipolar transistor structure 1000 comprises source areas 1085 in contact to a source metal layer 1086 for an electrical contact 1087 implanted into the body areas 1080. Additionally, also the body areas 1080 may be in contact to a source metal layer 1086, for example. Further, trenches comprising gates 1090 (e.g. poly silicon gates) reaching vertically through the body layer are arranged with predefined lateral distance to each other. The gates can be electrically connected through a gate wiring 1092 (not shown). The structure forming the gates may expand over at least a part of the insulated gate bipolar transistor arrangement connecting a plurality of gates 1090 located in trenches, for example. Optionally, the Mesa-insulated gate bipolar transistor structure 1000 may comprise a field stop layer between the drift layer 1070 and the collector layer 1060.

As already mentioned, the portion of area occupied or covered by source areas within first and the second configuration region may be varied.

FIG. 11 shows a schematic top view of an insulated gate bipolar transistor arrangement 1100 according to an embodiment. The insulated gate bipolar transistor arrangement 1100 comprises a plurality of trench-emitter-side insulated gate bipolar transistor structures as described above (e.g. FIG. 10). The source areas 1085 located in the first configuration region 1110 cover a larger portion of the first configuration region 1110 (portion of die area occupied by the source areas) than a portion of the second configuration region 1120 covered by the source areas 1085 located in the second configuration region 1120. By reducing the portion of areas occupied or covered by source areas 1085, the provided source current in the different regions can be varied so that a desired distribution of the average density of free charge carriers in an on-state of the insulated gate bipolar transistor arrangement 1100 can be obtained.

In other words, FIG. 11 shows an example of a view on the emitter-structures of a trench IGBT. The channel width per cell (1085 denote the n-source regions, i.e., the active channel area) is reduced from left to right.

Optionally, additionally or alternatively to one or more aspects mentioned above, each trench of the plurality of trenches surrounds a body region of the plurality of body regions. In this way, a trench insulated gate bipolar transistor structure may be implemented. In this case, the carrier confinement may be varied by a variation of the average distance of neighbouring body regions surrounded by trenches, for example. In other words, an average distance (e.g. averaged through the respective region) of neighbouring body regions (e.g. closest neighbour or closest neighbour in a predefined direction) surrounded by trenches located in the first configuration region may be different from an average distance of neighbouring body regions surrounded by trenches located in the second configuration region. By varying the distance of possible current sources towards the second configuration region, the desired average density of free charge carriers can be obtained.

FIG. 12 shows a schematic top view of an insulated gate bipolar transistor arrangement 1200 according to an embodiment. The insulated gate bipolar transistor arrangement 1200 comprises a plurality of trench-emitter-side insulated gate bipolar transistor structures as described above (e.g. FIG. 10). An average distance (e.g. averaged through the respective region) of neighbouring body regions (e.g. closest neighbour or closest neighbour in a predefined direction) surrounded by trenches 1090 located in the first configuration region 1210 may be smaller than an average distance of neighbouring body regions surrounded by trenches 1090 located in the second configuration region 1220. By increasing the distance of possible current sources 1085 towards the second configuration region 1230, the desired average density of free charge carriers can be obtained.

In other words, FIG. 12 shows a view on the emitter-structures of a trench IGBT. The density of the cells is reduced from left to right.

Optionally, additionally or alternatively to one or more aspects mentioned above, the depth of the trenches can be varied in order to influence the carrier confinement laterally. In other words, an average depth of trenches located in the first configuration region may be different from an average depth of trenches located in the second configuration region. Trenches reaching deep into the drift layer may cause a larger carrier confinement or density of free charge carriers in an on-state than trenches reaching only slightly through the body areas. Therefore, the desired average density of free charge carriers can be obtained by varying the depth of the trenches.

Figure 13A:
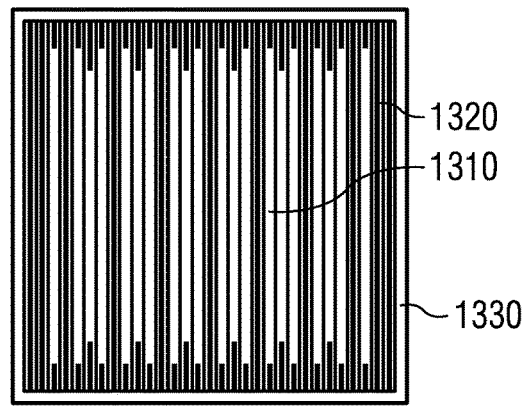
FIG. 13A shows a schematic top view of a semiconductor device with indicated Mesa conducting positions.

FIG. 13A shows a top view of a possible Mesa contacting. The first configuration region 1310 comprises a lower contact hole density for contacting Mesas than the second configuration region 1320 and the edge region 1330. The stripes represent openings of the cover oxide between Mesas and the emitter contact. The carrier confinement effect can be reduced by the increase of the contact hole density towards the chip edge 1330 causing a reduction of the storage charges within the device present in the on-state. Alternatively, a reduction or lowering of the contact hole density from the centre of the die to the edge region can be implemented in order to reduce the channel width towards the edge without an n-source shadowing.

Figure 13B:
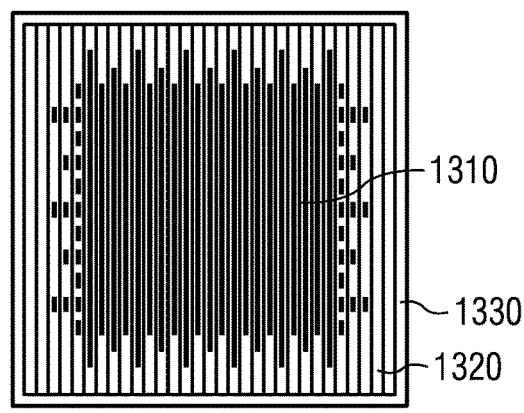
FIG. 13B shows a schematic top view of a semiconductor device with indicated source implant.

FIG. 13B shows a top view of a possible source implantation. The first configuration region 1310 comprises a higher average source implant area than the second configuration region 1320 and the edge region 1330. The stripes represent implanted source areas. The present storage charges within the device can also be reduced by the reduction of the MOS (metal oxide semiconductor) channel width in the direction toward the chip edge 1330.

Figure 13C:
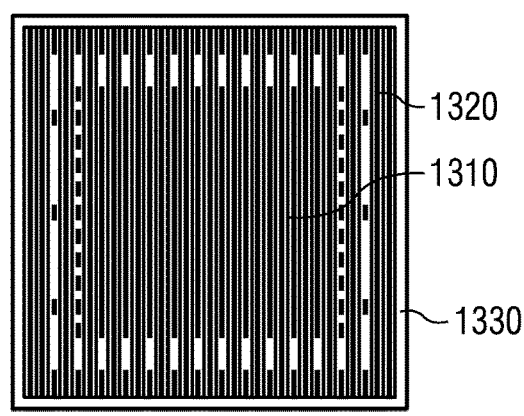
FIG. 13C shows a schematic top view of a semiconductor device by a combination of the semiconductor device shown in FIGS. 13A and 13B.

FIG. 13C shows a top view of a possible Mesa contacting and a possible source implantation according to a combination of the embodiments shown in FIG. 13A and FIG. 13B.

Figure 14A:
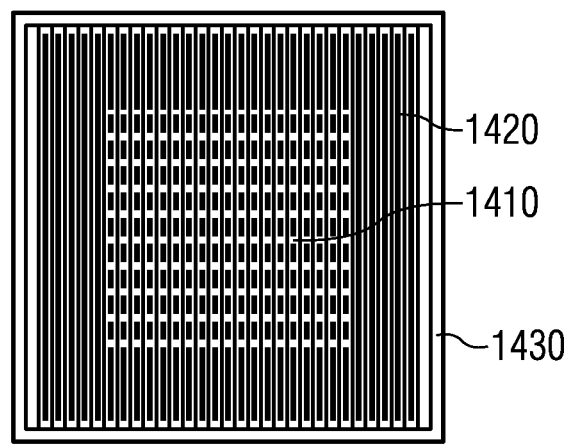
FIG. 14A shows a schematic top view of a semiconductor device with indicated source implant regions.
Figure 14B:
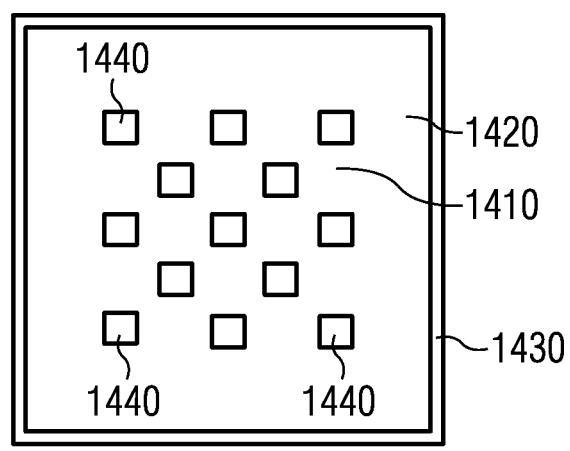
FIG. 14B shows a schematic top view of the backside of the semiconductor device shown in FIG. 14A with indicated ohmic contact regions.

FIG. 14A shows a top view of a front side and FIG. 14B of a back side of a reverse conducting insulated gate bipolar transistor (RC-IGBT) with a structuring of an MOS channel width according to an embodiment. The stripes shown in FIG. 14A represent implanted source regions. The squares 1440 in FIG. 14B represent n-conducting ohmic contact regions between the n-conducting drift region of the device and the collector or cathode contact (shorts). The current density distribution in an on-operating state of the device can be homogenized by the increase of the MOS channel width in the region without shorts. In this example, the first configuration region 1410 comprises the shorted areas 1440 while the second configuration region 1420 and the edge region 1430 do not comprise shorts.

Optionally, alternatively or additionally to one or more aspects mentioned above, the backside collector layer may be adapted so that the current flow from the source areas to the collector layer may mainly occur in the cell region. In other words, the collector layer may comprise a first average dopant density in the cell region (first doping region) and a second average dopant density in the edge region (second doping region). The first average dopant density may be higher than the second dopant density.

FIG. 15 shows a schematic cross section of a semiconductor device 1500 according to an embodiment. The semiconductor device 1500 comprises emitter-side insulated gate bipolar transistor structures (area with IGBT cells) within the first configuration region 1510 and the second configuration region 1520 according to one or more embodiments described above. Further, the semiconductor device 1500 comprises an edge region 1530 at the edge of the semiconductor device 1500 comprising a plurality of edge termination structures 1532 for reducing an electrical field towards the edge. Further, the backside collector layer comprises a first average dopant density 1540 (e.g. $p^+$) in the first doping region 1510 and a second average dopant density 1542 (e.g. p) in the second doping region 1530 (weakly doped emitter regions). The first average dopant density 1540 is higher than the second dopant density 1542.

FIG. 15 illustrates an example of a cross section through an insulated gate bipolar transistor and edge and shows a schematic edge termination including an opposite reduced p-emitter doping. This may keep the carrier flooding low, for example.

In some embodiments, the collector layer may comprise reverse conducting regions reaching through the collector layer to the drift layer and comprising the first conductivity type. In this way, reverse conducting insulated gate bipolar transistor (RC-IGBT) with improved durability may be provided.

FIG. 16 shows a schematic backside view of a reverse conducting insulated gate bipolar transistor structure 1600 (RC-IGBT). The insulated gate bipolar transistor structure 1600 comprises reverse conducting regions 1612 reaching through the collector layer to the drift layer representing first doping regions and comprising the same conductivity type as the drift layer within the cell region 1610. The cell region is surrounded by a pilot region 1620 comprising no reverse conducting regions. The second doping region may be arranged between the first conducting regions and/or the pilot region 1620. The reverse conducting insulated gate bipolar transistor structure 1600 is surrounded by an edge region 1630. Further, a gate pad 1640 is arranged in the proximity of a corner of the reverse conducting insulated gate bipolar transistor structure 1600.

FIG. 16 shows a layout of a backside mask indicating n+-stripes in the middle 1610. An extensive p-pilot-region 1620 can be arranged in the proximity of the edge at the backside, which may enable as snapback free characteristic.

For example, the carrier confinement driven by the implementation of the main surface may consider the emitter efficiency of the opposite backside. The emitter efficiency may be influenced by the density and dimension of n-shorts, p⁺-regions for softness improvement and/or field stop variations, for example.

Figure 17:
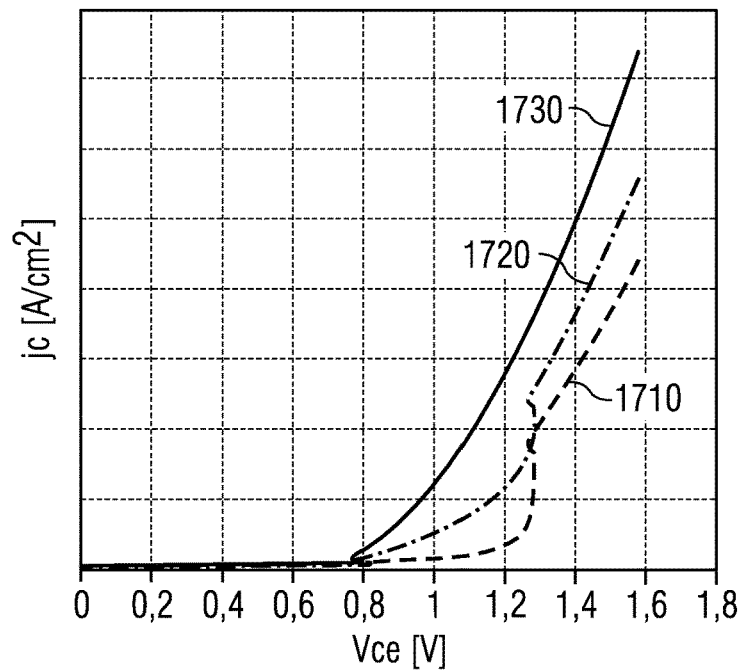
FIG. 17 shows a diagram indicating a current density over a collector emitter voltage of a semiconductor device with homogenous source implants.
Figure 18:
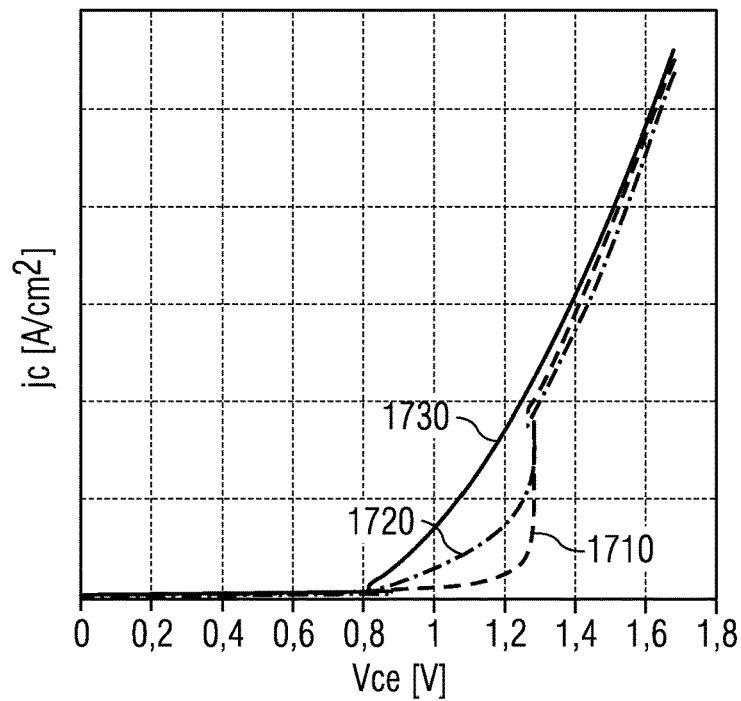
FIG. 18 shows a diagram indicating a current density over a collector emitter voltage of a semiconductor device with inhomogeneous source implants.

FIG. 17 shows a current density $J_c$ over voltage $V_{ce}$ characteristic of a device with homogeneous n⁺ regions and FIG. 18 shows a current density $J_c$ over voltage $V_{ce}$ characteristic of a device with inhomogeneous n⁺ regions. A current density of an average diode area 1710, an average p-pilot region 1730 and an average total current density 1720 is illustrated.

The average values of the current density within the regions (e.g. FIG. 17) show that the p⁺-stripe has ignited in the region of nominal current density. However, the mean current density in the region of the stripes (diode area) is significantly lower than in the p-pilot-region. The source sided emitter efficiency within the p-pilot-region may be partly lowered or reduced in order to homogenize the current density and in this way the heating over the whole active area. For example, the n⁺ implantation was partly removed compared to the p-pilot-region for the simulation structure. This may result in an equal mean current density in the diode region and in the p-pilot (e.g. FIG. 18).

Figure 19:
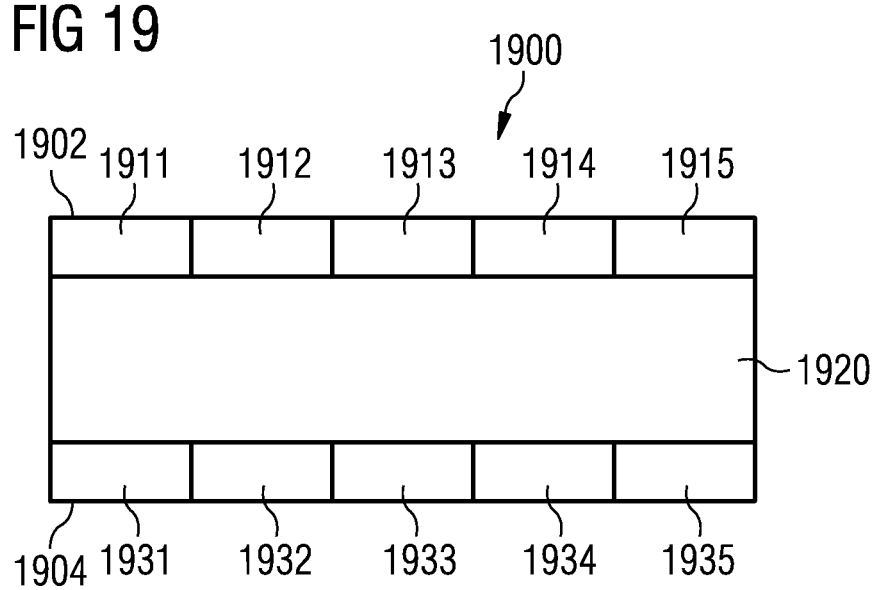
FIG. 19 shows a schematic cross-section of a semiconductor device.

FIG. 19 shows a schematic cross-section of a part of a semiconductor device 1900 according to an embodiment. The semiconductor device 1900 comprises an insulated gate bipolar transistor arrangement. The insulated gate bipolar transistor arrangement comprises a plurality of configuration regions arranged within a cell region of the semiconductor device at a main surface 1902 of the semiconductor substrate of the semiconductor device 1900. Each configuration region 1911-1915 of the plurality of configuration regions comprises emitter-side insulated gate bipolar transistor structures. Further, the insulated gate bipolar transistor arrangement comprises a collector layer and a drift layer 1920. The collector layer is arranged at a backside surface 1904 of the semiconductor substrate of the semiconductor device 1900 and the drift layer 1920 is arranged between the collector layer and the emitter-side insulated gate bipolar transistor structures of the plurality of configuration regions. Additionally, the collector layer comprises a plurality of doping regions within the cell region at the backside surface 1904 of the semiconductor substrate of the semiconductor device 1900. The doping regions 1931-1935 of the plurality of doping regions comprise at least partly different charge carrier life times, different conductivity types or different doping concentrations. Further, the configuration regions 1911-1915 of the plurality of configuration regions and the doping regions 1931-1935 of the plurality of doping regions are configured so that the average densities of free charge carriers within parts of the drift layer facing the respective doping regions of the plurality of doping regions differ from each other by less than 20% of an average densities of free charge carriers within the cell region in an on-state of the semiconductor device.

By implementing different configurations of emitter-side insulated gate bipolar transistor structures at the main surface opposite to different doping regions at the back side, the varying influence to the density of free charge carriers of the different doping regions can be at least partly compensated by the different configurations of emitter-side insulated gate bipolar transistor structures so that the difference between the average densities of free charge carriers can be kept low. In this way, the temperature distribution over at least a part of the semiconductor substrate in the on-state can be kept very homogenous. Therefore, the life-cycle or durability of the device may be increased.

More details and aspects are described in connection with the embodiments above (e.g. FIG. 1A-2B).

The semiconductor device 1900 may comprise one or more optional, additional features corresponding to one or more aspects mentioned in connection with the described concept or one or more embodiments described above.

Figure 20:
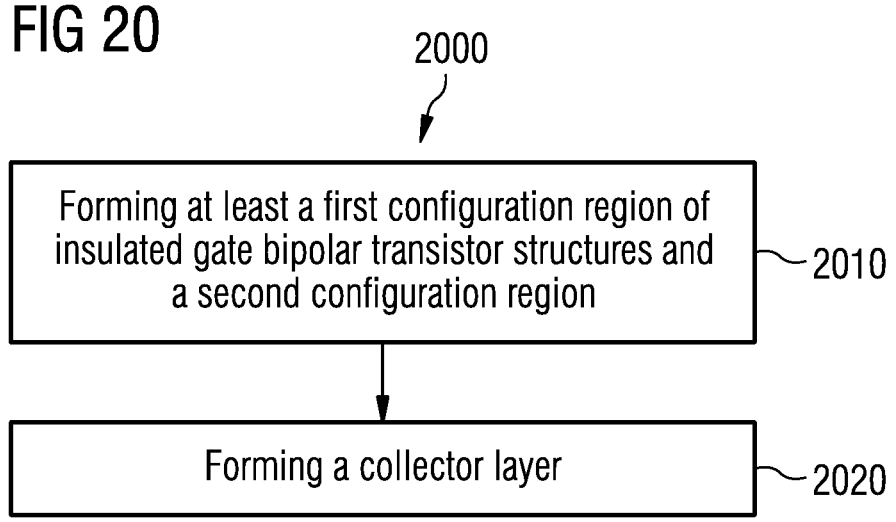
FIG. 20 shows a flowchart of a method for forming a semiconductor device.

FIG. 20 shows a flowchart of a method 2000 for forming a semiconductor device comprising an insulated gate bipolar transistor arrangement according to an embodiment. The method 2000 comprises forming 2010 at least a first configuration region of emitter-side insulated gate bipolar transistor structures of the insulated gate bipolar transistor arrangement and a second configuration region of emitter-side insulated gate bipolar transistor structures of the insulated gate bipolar transistor arrangement arranged at a main surface of a semiconductor substrate of the semiconductor device. Further, the method 2000 comprises forming 2020 a collector layer of the insulated gate bipolar transistor arrangement arranged at a backside surface of the semiconductor substrate of the semiconductor device. A drift layer is arranged between the collector layer and the emitter-side insulated gate bipolar transistor structures of the first configuration region and the second configuration region. Additionally, the collector layer comprises at least a first doping region laterally adjacent to a second doping region, wherein the first doping region and the second doping region comprise different charge carrier life times, different conductivity types or different doping concentrations. The first configuration region is located with at least a partial lateral overlap to the first doping region and the second configuration region is located with at least a partial lateral overlap to the second doping region. Further, the first configuration region, the first doping region, the second configuration region and the second doping region are configured so that a first average density of free charge carriers within a part of the drift layer facing the first doping region differs from a second average density of free charge carriers within a part of the drift layer facing the second doping region by less than 20% of the second average density in an on-state of the semiconductor device.

The method 2000 may comprise one or more optional additional acts corresponding to one or more aspects mentioned in connection with the described concept or one or more embodiments described above.

Some embodiments relate to a semiconductor device implementing an insulated gate bipolar transistor device comprising a blocking voltage in the range of 400 V to 1700 V.

Some embodiments relate to an insulated gate bipolar transistor device with a lateral variation of the emitter zone to provide a means for lateral optimization or improvement of the current and plasma density.

FIG. 8 shows a cross cut through an emitter structure of a micro pattern trench-insulated gate bipolar transistor (MPT-IGBT), for example. The width of the Mesas in the cells is increased from left to right. The shape of the Mesa structures can comprise various geometries (e.g. stripes, islands, circles or similar). Alternatively, the cell pitch may be kept constant (e.g. for a kGkS4-cell, where k denotes a contacted Mesa and G and S denote gate and source trenches respectively) with increasing contacting of the source Mesas from left to right (e.g. kGkSSSS-kGkSkSSS-kGkSkSkSS-kGkSkSkSkSkSkS). An example is shown in FIG. 7.

The proposed concept or method can be used for reverse blocking as well as reverse conducting insulated gate bipolar transistors, for example. Also further proposed design measures may be implemented additionally or alternatively in order to obtain a desired or aimed flooding.

For example, it is also possible for reverse conducting insulated gate bipolar transistors (RC-IGBT) to implement another Mesa width or also other additional or alternatively proposed design measures in the region of the so-called ignition structure (which comprises over a certain area region no highly n-doped shorts at the backside in order to provide a sufficient ignition expansion) than in a region, which comprises the shorts in order to obtain or enable a homogenization of the device properties. A large area three-dimensional (3D) structure can be build-up in order to demonstrate this by means of device simulation (e.g. FIG. 16). The front-side trench structure can be replaced by a homogenously doped $n^+$-region (for the simulation). FIG. 16 shows a layout of a backside mask indicating $n^+$-stripes in the middle. $p^+$-stripes are arranged between the $n^+$-stripes and between the striped region and the edge is a $p^+$-pilot-region arranged. An extensive p-pilot-region can be arranged in the proximity of the edge at the backside, which may enable as snapback free characteristic. There is a $p^+$-stripe at the right half (towards the centre of the device), which injects holes in the IGBT-mode, and an $n^+$-stripe, which injects electrons in the diode mode. The average values of the current density within the regions (e.g. FIG. 17) show that the $p^+$-stripe has ignited in the region of nominal current density. However, the mean current density in the region of the stripes (diode area) is significantly lower than in the p-pilot-region. The source sided emitter efficiency within the p-pilot-region may be partly lowered or reduced in order to homogenize the current density and in this way the heating over the whole active area. For example, the $n^+$ implantation was partly removed compared to the p-pilot-region for the simulation structure. This may result in an equal mean current density in the diode region and in the p-pilot (e.g. FIG. 18). The cross ignition into the p-stripes may be promoted in this configuration, since the low current density is larger in the ignition region. $V_{ce,sat}$ is larger in this configuration, since the active area in the IGBT-mode is effectively reduced in this configuration, for example. By a moderate lowering or reduction of the source sided emitter efficiency ($n^+$ doping in the simulation structure), the $V_{ce,sat}$-increase can be kept within a limit. The selected configuration may depend on the operation of the RC-IGBT (e.g. frequency, feedback mode), for example.

The described reduction of the Mesa width may also be combined with a local reduction of the backside emitter efficiency in the edge region of the device in order to increase the effectiveness of the proposed measure. For this, the doping height or doping concentration of the backside emitter can be reduced or alternatively or additionally a doping of an optionally existing field stop zone in the edge region can be increased or alternatively or additionally, an intended reduction of the lifetime of free charge carriers can be implemented by irradiation techniques (e.g. light ions or electrons) or diffusing heavy metal (ions) into the semiconductor material.

In other words, an additional measure to counteract the raised hole currents is an omission of the backside emitter in the edge region. Also the reverse blocking capability may be affected at these structures.

Additionally (or alternatively) an intended reduction of the source zone width and/or the source zone length or also an omission of source zone regions in the different regions can be implemented in order to vary the injection of free charge carriers in the different regions.

Further, additionally or alternatively, a variation of the cell pitch (e.g. distance of trenches) within the different regions can be implemented.

It may also be possible to obtain a homogenization of the temperature distribution within the IGBT-chip by the proposed design measures, if a higher current density is reached or intended in the better cooled regions than in the less cooled regions.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising an insulated gate bipolar transistor arrangement,
the insulated gate bipolar transistor arrangement comprising at least a first configuration region of emitter-side insulated gate bipolar transistor structures, wherein each emitter-side insulated gate bipolar transistor structure of the first configuration region comprises a body area, a source area, and a gate, and a second configuration region of emitter-side insulated gate bipolar transistor structures, wherein each emitter-side insulated gate bipolar transistor structure of the second configuration region comprises a body area, a source area, and a gate, wherein the first configuration region and the second configuration region are arranged at a main surface of a semiconductor substrate of the semiconductor device,
wherein the insulated gate bipolar transistor arrangement comprises a collector layer and a drift layer which are part of the semiconductor substrate, wherein the collector layer is arranged at a backside surface of the semiconductor substrate of the semiconductor device and the drift layer is arranged between the collector layer and the emitter-side insulated gate bipolar transistor structures of the first configuration region and the second configuration region,
wherein the collector layer comprises at least a first doping region laterally adjacent to a second doping region, wherein the first doping region and the second doping region comprise different charge carrier life times, different conductivity types or different doping concentrations,
wherein the first configuration region is located with at least a partial lateral overlap to the first doping region and the second configuration region is located with at least a partial lateral overlap to the second doping region, and
wherein the emitter-side insulated gate bipolar transistor structures of the first configuration region and the second configuration region comprise a plurality of body areas, a plurality of source areas and a plurality of gates each, wherein the plurality of source areas and the drift layer comprise at least mainly a first conductivity type, wherein the plurality of body areas and the collector layer comprise at least mainly a second conductivity type, wherein the plurality of gates are arranged so that the gates are capable of causing a conductive channel between the source areas and the drift layer through the body areas,
wherein the emitter-side insulated gate bipolar transistor structures of the first configuration region and the second configuration region comprise a plurality of trenches reaching vertically through a body layer comprising the plurality of body regions, wherein the gates are arranged in trenches of the plurality of trenches, and
wherein an average depth of the gates within trenches located in the first configuration region is different from an average depth of the gates within trenches located in the second configuration region, and wherein the differences in average depth compensates for a difference in density of free charge carriers during an on-state of the insulated gate bipolar transistor arrangement caused by the different charge carrier life times, different conductivity types or different doping concentrations.

2. The semiconductor device of claim 1, wherein the first configuration region, the first doping region, the second configuration region and the second doping region comprise each a lateral dimension of more than half of a diffusion length of free charge carriers within the drift layer or more than half of a thickness of the semiconductor substrate of the semiconductor device.

3. The semiconductor device of claim 1, wherein the first doping region and the second doping region are configured so that the first doping region is capable of providing a higher average density of charge carriers to the drift layer in an on-state of the semiconductor device than the second doping region, wherein the emitter-side insulated gate bipolar transistor structures of the first configuration region and the emitter-side insulated gate bipolar transistor structures of the second configuration region are configured so that the emitter-side insulated gate bipolar transistor structures of the second configuration region are capable of providing a higher average density of charge carriers to the drift layer in an on-state of the semiconductor device than the emitter-side insulated gate bipolar transistor structures of the first configuration region.

4. The semiconductor device of claim 1, wherein the first configuration region is located laterally adjacent to the second configuration region.

5. The semiconductor device of claim 1, wherein the drift layer comprise at least mainly a first conductivity type and the collector layer comprise at least mainly a second conductivity type.

6. The semiconductor device of claim 1, wherein the first configuration region and the second configuration region are located within a cell region of the semiconductor substrate, wherein the cell region is laterally enclosed by an edge region surrounding the semiconductor substrate at an edge of the semiconductor substrate, wherein the edge region comprises a width of less than a quarter of a lateral dimension of the semiconductor substrate.

7. The semiconductor device of claim 1, wherein the insulated gate bipolar transistor arrangement comprises a plurality of configuration regions arranged within a cell region of the semiconductor device at the main surface of the semiconductor substrate of the semiconductor device, wherein the collector layer comprises a plurality of doping regions arranged within the cell region at the backside surface of the semiconductor substrate of the semiconductor device, wherein the configuration regions of the plurality of configuration regions and the doping regions of the plurality of doping regions are configured so that the average densities of free charge carriers within parts of the drift layer facing the respective doping regions of the plurality of doping regions differ from each other by less than 20% of an average densities of free charge carriers within the cell region in an on-state of the semiconductor device.

8. The semiconductor device of claim 1, wherein the insulated gate bipolar transistor arrangement comprises a source current supply circuit configured to provide in an on-state of the insulated gate bipolar transistor arrangement a first average source current to the source areas located in the first configuration region and a second average source current to the source areas located in the second configuration region, wherein the first average source current is different from the second average source current.

9. The semiconductor device of claim 1, wherein the source areas located in the first configuration region cover a larger portion of the first configuration region than a portion of the second configuration region covered by the source areas located in the second configuration region.

10. The semiconductor device of claim 1, wherein an average channel width controllable by the gates located in the first configuration region is larger than an average channel width controllable by the gates located in the second configuration region.

11. The semiconductor device of claim 1, wherein an average depth of trenches located in the first configuration region is different from an average depth of trenches located in the second configuration region.

12. The semiconductor device of claim 1, wherein gates are arranged in a first part of the plurality of trenches and a plurality of spacer structures are arranged within a second part of the plurality of trenches, wherein an average number of spacer structures between neighboring gates in the first configuration region is different from an average number of spacer structures between neighboring gates in the second configuration region.

13. The semiconductor device of claim 1, wherein the second doping regions are reverse conducting regions reaching through the collector layer to the drift layer and comprise the first conductivity type.

14. A semiconductor device comprising an insulated gate bipolar transistor arrangement,
the insulated gate bipolar transistor arrangement comprising at least a first configuration region of emitter-side insulated gate bipolar transistor structures, wherein each emitter-side insulated gate bipolar transistor structure of the first configuration region comprises a body area, a source area, and a gate, and a second configuration region of emitter-side insulated gate bipolar transistor structures, wherein each emitter-side insulated gate bipolar transistor structure of the second configuration region comprises a body area, a source area, and a gate, wherein the first configuration region and the second configuration region are arranged at a main surface of a semiconductor substrate of the semiconductor device,
wherein the insulated gate bipolar transistor arrangement comprises a collector layer and a drift layer which are part of the semiconductor substrate, wherein the collector layer is arranged at a backside surface of the semiconductor substrate of the semiconductor device and the drift layer is arranged between the collector layer and the emitter-side insulated gate bipolar transistor structures of the first configuration region and the second configuration region,
wherein the collector layer comprises at least a first doping region laterally adjacent to a second doping region, wherein the first doping region and the second doping region comprise different charge carrier life times, different conductivity types or different doping concentrations,
wherein the first configuration region is located with at least a partial lateral overlap to the first doping region and the second configuration region is located with at least a partial lateral overlap to the second doping region, and
wherein the emitter-side insulated gate bipolar transistor structures of the first configuration region and the second configuration region comprise a plurality of body areas, a plurality of source areas and a plurality of gates each, wherein the plurality of source areas and the drift layer comprise at least mainly a first conductivity type, wherein the plurality of body areas and the collector layer comprise at least mainly a second conductivity type, wherein the plurality of gates are arranged so that the gates are capable of causing a conductive channel between the source areas and the drift layer through the body areas,
wherein the emitter-side insulated gate bipolar transistor structures of the first configuration region and the second configuration region comprise a plurality of trenches reaching vertically through a body layer comprising the plurality of body regions, wherein the gates are arranged in trenches of the plurality of trenches, and wherein an average distance of neighboring trenches located in the first configuration region is different from an average distance of neighboring trenches located in the second configuration region, and wherein the differences in average distance of neighboring trenches compensates for the difference in density of free charge carriers during an on-state of the insulated gate bipolar transistor arrangement caused by the different charge carrier life times, different conductivity types or different doping concentrations.

15. A semiconductor device comprising an insulated gate bipolar transistor arrangement, the insulated gate bipolar transistor arrangement comprising at least a first configuration region of emitter-side insulated gate bipolar transistor structures, wherein each emitter-side insulated gate bipolar transistor structure of the first configuration region comprises a body area, a source area, and a gate, and a second configuration region of emitter-side insulated gate bipolar transistor structures, wherein each emitter-side insulated gate bipolar transistor structure of the second configuration region comprises a body area, a source area, and a gate, wherein the first configuration region and the second configuration region are arranged at a main surface of a semiconductor substrate of the semiconductor device, wherein the insulated gate bipolar transistor arrangement comprises a collector layer and a drift layer which are part of the semiconductor substrate, wherein the collector layer is arranged at a backside surface of the semiconductor substrate of the semiconductor device and the drift layer is arranged between the collector layer and the emitter-side insulated gate bipolar transistor structures of the first configuration region and the second configuration region, wherein the collector layer comprises at least a first doping region laterally adjacent to a second doping region, wherein the first doping region and the second doping region comprise different charge carrier life times, different conductivity types or different doping concentrations, wherein the first configuration region is located with at least a partial lateral overlap to the first doping region and the second configuration region is located with at least a partial lateral overlap to the second doping region, and wherein the emitter-side insulated gate bipolar transistor structures of the first configuration region and the second configuration region comprise a plurality of body areas, a plurality of source areas and a plurality of gates each, wherein the plurality of source areas and the drift layer comprise at least mainly a first conductivity type, wherein the plurality of body areas and the collector layer comprise at least mainly a second conductivity type, wherein the plurality of gates are arranged so that the gates are capable of causing a conductive channel between the source areas and the drift layer through the body areas, wherein the emitter-side insulated gate bipolar transistor structures of the first configuration region and the second configuration region comprise a plurality of trenches reaching vertically through a body layer comprising the plurality of body regions, wherein the gates are arranged in trenches of the plurality of trenches, and wherein each trench of the plurality of trenches surrounds a body region of the plurality of body regions, wherein an average distance of neighboring body regions surrounded by trenches located in the first configuration region is different from an average distance of neighboring body regions surrounded by trenches located in the second configuration region, and wherein the differences in average distance of neighboring body regions compensates for the difference in density of free charge carriers during an on-state of the insulated gate bipolar transistor arrangement caused by the different charge carrier life times, different conductivity types or different doping concentrations.

* * * * *

UNITED STATES PATENT AND TRADEMARK OFFICE
CERTIFICATE OF CORRECTION

PATENT NO. : 10,475,910 B2
APPLICATION NO. : 14/834542
DATED : November 12, 2019
INVENTOR(S) : J. Laven et al.

Page 1 of 1

It is certified that error appears in the above-identified patent and that said Letters Patent is hereby corrected as shown below:

In the Claims

Column 27, Line 18 (Claim 5, Line 2) please change "comprise at" to -- comprises at --
Column 27, Line 19 (Claim 5, Line 3) please change "comprise at" to -- comprises at --
Column 27, Line 43 (Claim 7, Line 15) please change "densities of" to -- density of --

Signed and Sealed this
Twenty-eighth Day of January, 2020

Andrei Iancu
*Director of the United States Patent and Trademark Office*